United States Patent
Dutta et al.

(10) Patent No.: US 11,288,430 B2
(45) Date of Patent: Mar. 29, 2022

(54) PRODUCING MODELS FOR DYNAMICALLY DEPLETED TRANSISTORS USING SYSTEMS HAVING SIMULATION CIRCUITS

(71) Applicant: GLOBALFOUNDRIES U.S. Inc., Malta, NY (US)

(72) Inventors: Anupam Dutta, Bangalore (IN); Tamilmani Ethirajan, Guilderland, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 857 days.

(21) Appl. No.: 15/822,661

(22) Filed: Nov. 27, 2017

(65) Prior Publication Data

US 2019/0163853 A1  May 30, 2019

(51) Int. Cl.
*G06F 30/367* (2020.01)
*G06F 30/30* (2020.01)

(52) U.S. Cl.
CPC ............ *G06F 30/367* (2020.01); *G06F 30/30* (2020.01)

(58) Field of Classification Search
CPC ................. G06F 30/367; G06F 30/30
See application file for complete search history.

(56) References Cited

U.S. PATENT DOCUMENTS

| | | |
|---|---|---|
| 5,550,760 A | 8/1996 | Razdan et al. |
| 5,825,673 A | 10/1998 | Watanabe |
| 7,103,522 B1 | 9/2006 | Shepard |
| 7,409,327 B2 | 8/2008 | Deliwala |
| 8,375,341 B2 | 2/2013 | Daghighi et al. |

(Continued)

FOREIGN PATENT DOCUMENTS

| | | |
|---|---|---|
| TW | 378403 | 1/2000 |
| TW | 200924075 A1 | 6/2009 |
| TW | 201108413 A1 | 3/2011 |

OTHER PUBLICATIONS

Khandelwal et al., "Effective Width Modeling for Body-Contacted Devices in Silicon-on-Insulator Technology," NSTI-Nanotech, vol. 3, 2009, pp. 562-565.

(Continued)

*Primary Examiner* — Kamini S Shah
*Assistant Examiner* — Peter Pham
(74) *Attorney, Agent, or Firm* — Gibb & Riley, LLC; Anthony Canale

(57) ABSTRACT

A simulation circuit, that simulates characteristics of transistors is produced to include: an isolation body resistor representing resistance of a channel isolation portion of a transistor; a main body resistor representing resistance of main channel portion of the transistor; an isolation transistor connected to the isolation body resistor; and a body-contact transistor connected to the main body resistor. Simulated data is generated by supplying test inputs to the simulation circuit, while selectively activating either the isolation transistor or the body-contact transistor. Test data is generated by supplying the test inputs to the transistors, and measuring output of the transistors. The simulated data is compared to the test data to identify data differences. The design of the transistors is changed to reduce the data differences. The generation of test data, comparing, and design changes are repeated, until the data differences are within a threshold.

20 Claims, 12 Drawing Sheets

(56) References Cited

U.S. PATENT DOCUMENTS

| | | |
|---|---|---|
| 2004/0054514 A1 | 3/2004 | Flatresse et al. |
| 2005/0055191 A1* | 3/2005 | Hogyoku .............. G06F 30/367 |
| | | 703/15 |
| 2014/0009214 A1* | 1/2014 | Altunkilic ............ H03K 17/161 |
| | | 327/427 |
| 2015/0137246 A1* | 5/2015 | Shapiro .................. H01L 29/78 |
| | | 257/350 |
| 2016/0064561 A1* | 3/2016 | Brindle ................ H03K 17/162 |
| | | 257/348 |
| 2016/0275225 A1* | 9/2016 | Dutta ...................... G06F 30/39 |
| 2017/0206297 A1 | 7/2017 | Meyer |

OTHER PUBLICATIONS

Su et al., "A Body-Contact SOI MOSFET Model for Circuit Simulation," IEEE International SOI Conference, Oct. 1999, pp. 50-51.

Taiwanese Application No. 107130140, JIND006-TW-NP, Notice of Allowance dated Jun. 27, 2019 and Search Report dated Jun. 24, 2019, pp. 1-5.

\* cited by examiner

| Body contact type | Top view of the MOSFET | Area_tab | L_tab | W_tab/finger | Fr |
|---|---|---|---|---|---|
| T-gate | | $pwbp \times \left( \begin{array}{c} diffL \ diffR \\ +nf \times L+ \\ (nf-1) \times diffM \end{array} \right)$ | $\left( \begin{array}{c} diffL \ diffR \\ +nf \times L+ \\ (nf-1) \times diffM \end{array} \right)$ | pwbp | $\alpha \times \left(1 - \ln\left(1 + \frac{\beta}{L}\right)\right)$ |
| I-gate | | $2 \times pwbp \times \left( \begin{array}{c} diffL \ diffR \\ +nf \times L+ \\ (nf-1) \times diffM \end{array} \right)$ | $\left( \begin{array}{c} diffL \ diffR \\ +nf \times L+ \\ (nf-1) \times diffM \end{array} \right)$ | 2xpwbp | $\alpha \times \left(1 - \ln\left(1 + \frac{\beta}{L}\right)\right)$ |
| L-gate | | $pwbp \times \left( \begin{array}{c} nf \times L+ \\ diffL\_odd \\ diffM \\ numMidSources \end{array} \right)$ | pwbp | $\dfrac{\left( \begin{array}{c} nf \times L + diffL\_odd \\ diffM \ numMidSource_j \end{array} \right)}{nf}$ | $\left( \alpha + \dfrac{\beta}{L} \right)$ |
| H-gate | | $BPlength \times PCwidthOnBP$ | BPlength | PCwidthOnBP | $\ln\left(1 + \dfrac{\beta}{L}\right)$ |

FIG. 12

PRODUCING MODELS FOR DYNAMICALLY DEPLETED TRANSISTORS USING SYSTEMS HAVING SIMULATION CIRCUITS

BACKGROUND

Field of the Invention

The present disclosure relates to evaluating different designs of transistors, and more specifically, to producing models for dynamically depleted transistors using systems having simulation circuits.

DESCRIPTION OF RELATED ART

Dynamically depleted silicon-on-insulator (DDSOI) metal oxide semiconductor field effect transistors (MOSFETs) have the ability to vary body impedance depending upon bias. More specifically, depending upon bias applied, the channel regions of such devices can be partially depleted (where there is a finite body-impedance); however, at higher bias, the neutral region vanishes, and the device becomes fully depleted (there is infinite body-impedance). Such devices are referred to as being dynamically depleted (DD) because they exhibit partially depleted (PD) and fully depleted (FD) characteristics, depending on operation condition. Accurate modeling the body impedance of dynamically depleted devices is even more complicated than in partially depleted device; yet it is useful to enable the designer to explore full potential of this technology.

For example, body-contacted silicon-on-insulator (SOI) MOSFETs are useful in radio frequency (RF) switches, high breakdown low noise amplifier (LNA) devices (used as a cascade device) that have good linearity, and digital logic, with a low standby leakage current. For RF distortion it is useful to capture low frequency characteristics, and at the same time RF behavior also should be accurately predicted.

For example, some devices suffer low frequency response, which can be related to current conduction from the on-state breakdown due to impact ionization and floating-body effects on Gds of body-contacted DDSOI MOSFET. This can also be due to drain-source fringe field; body-contact region conducts "excess" drain current and impact ionization current. Also, this can be due to the source/drain-body-contact junction, where substantial diode current flows through this junction in forward bias condition of DDSOI MOSFETs. Therefore, accurate modeling the body impedance of dynamically depleted devices, where the physical aspects originate from the distributed nature of such devices, would be highly useful for such devices.

SUMMARY

Various methods herein begin with previously manufactured dynamically depleted silicon-on-insulator (DDSOI) metal oxide semiconductor field effect transistors (MOSFETs) that are to be evaluated. The DDSOI MOSFETs include a gate conductor, where the gate conductor has a gate isolation portion and a main gate portion (that have different doping impurities), and a semiconductor channel separated from the gate conductor by a gate insulator. The semiconductor channel has a channel isolation portion (adjacent the gate isolation portion of the gate conductor), and a main channel portion adjacent the main gate portion of the gate conductor.

Also, methods herein produce a simulation circuit (which can be an actual physical circuit, or a simulation within software) that simulates characteristics of the DDSOI MOSFETs. The simulation circuit is produced to include an isolation body resistor representing the resistance of the channel isolation portion, a main body resistor representing the resistance of the main channel portion, an isolation transistor connected to the isolation body resistor, and a body-contact transistor connected to the main body resistor. This allows these methods to generate simulated data by supplying test inputs to the simulation circuit, while selectively activating either the isolation transistor or the body-contact transistor. Selective activation of the isolation transistor and the body-contact transistor restricts which resistor in the simulation circuit receives the test inputs, so as to produce independent simulated data for the isolation body resistor and the main body resistor.

More specifically, the process of producing the simulation circuit includes receiving design input, and performing a model extraction process to establish characteristics of the isolation body resistor and the main body resistor, the isolation transistor, and the body-contact transistor, using the design input. Here, the design input includes transistor current, transistor voltage, transistor length, and transistor width of the DDSOI MOSFETs. Different characteristics of the design input change aspects of the simulation circuit produced by the model extraction process.

The main gate portion can include a gate body-contact portion adjacent the gate isolation portion, and a gate floating-body portion distal to the gate isolation portion. In such a case, the methods herein produce the simulation circuit to further include a gate isolation resistor (representing the resistance of the gate isolation portion) that is connected to the isolation transistor, a gate body-contact resistor (representing the resistance of the gate body-contact portion) that is connected to the body-contact transistor, a gate floating-body resistor (representing the resistance of the gate floating-body portion), and a floating-body transistor connected to the gate floating-body resistor. Additionally, the main channel portion of the semiconductor channel of the DDSOI MOSFETs can includes a channel body-contact portion adjacent the gate body-contact portion of the gate conductor, and a channel floating-body portion adjacent the gate floating-body portion of the gate conductor.

With such, a body-tab sub-transistor of the DDSOI MOSFETs includes the gate isolation portion of the gate conductor and the channel isolation portion of the semiconductor channel. In view of this, the simulation circuit is produced to include a body-tab sub-transistor simulation (that simulates the body-tab sub-transistor of the DDSOI MOSFETs) that includes the gate isolation resistor, the isolation body resistor, and the isolation transistor. Activation of the isolation transistor, combined with deactivation of the body-contact transistor and floating-body transistor, provides body-tab simulation data from the body-tab sub-transistor simulation.

Similarly, a body-contact sub-transistor of the DDSOI MOSFETs includes the gate body-contact portion of the gate conductor and the main channel portion of the semiconductor channel. Therefore, the simulation circuit is produced to include a body-contact sub-transistor simulation (that simulates the body-contact sub-transistor of the DDSOI MOSFETs) that includes the gate body-contact resistor, the main body resistor, and the body-contact transistor. Activation of the body-contact transistor, combined with deactivation of the isolation transistor and floating-body transistor, provides body-contact simulation data from the body-contact sub-transistor simulation.

Also, a floating-body sub-transistor of the DDSOI MOSFETs includes the gate floating-body portion of the gate conductor and the channel floating-body portion of the semiconductor channel. Thus, the simulation circuit is produced to include a floating-body sub-transistor simulation (that simulates the floating-body sub-transistor of the DDSOI MOSFETs) and that includes the gate floating-body resistor and the floating-body transistor. Activation of the floating-body transistor, combined with deactivation of the isolation transistor and body-contact transistor, provides floating-body simulation data from a floating-body sub-transistor simulation.

These methods physically connect the DDSOI MOSFET's to a testing system, and generate test data by supplying the test inputs to the DDSOI MOSFETs and measuring output of the DDSOI MOSFETs using the testing system.

Additionally, methods herein compare the simulated data to the test data to identify data differences. Further, with methods herein a design of the DDSOI MOSFETs can be changed iteratively to reduce the data differences. Thus, the processes of generating test data, comparing, and changing the design, can be repeated until the data differences are within a threshold, after which a final design is produced. Therefore, these methods output the final design that can be used to manufacture the DDSOI MOSFETS.

Various system including a designer input module (user input) that is capable of receiving characteristics of the DDSOI MOSFETs, a processor (that is capable of producing a simulation circuit that simulates characteristics of the DDSOI MOSFETs) that is in communication with the designer input module, and a testing system capable of being physically connected to the DDSOI MOSFETs. The processor produces the simulation circuit to include an isolation body resistor (representing the resistance of the channel isolation portion), a main body resistor (representing the resistance of the main channel portion), an isolation transistor connected to the isolation body resistor, and a body-contact transistor connected to the main body resistor.

More specifically, when producing the simulation circuit, the processor is capable of performing a model extraction process to establish characteristics of the isolation body resistor and the main body resistor, the isolation transistor, and the body-contact transistor, using the characteristics of the DDSOI MOSFETs. These characteristics of the DDSOI MOSFETs include transistor current, transistor voltage, transistor length, and transistor width of the DDSOI MOSFETs. Different characteristics of the DDSOI MOSFETs change aspects of the simulation circuit produced by the model extraction process.

The processor is capable of generating simulated data by supplying test inputs to the simulation circuit, while selectively activating either the isolation transistor or the body-contact transistor. Selective activation of the isolation transistor and the body-contact transistor by the processor restricts which resistor in the simulation circuit receives the test inputs, so as to produce independent simulated data for the isolation body resistor and the main body resistor.

The main gate portion of the DDSOI MOSFETs can include a gate body-contact portion adjacent the gate isolation portion, and a gate floating-body portion distal to the gate isolation portion. Thus, the simulation circuit is produced by the processor to further include a gate isolation resistor (representing the resistance of the gate isolation portion) that is connected to the isolation transistor, a gate body-contact resistor (representing the resistance of the gate body-contact portion) that is connected to the body-contact transistor, a gate floating-body resistor (representing the resistance of the gate floating-body portion), and a floating-body transistor that is connected to the gate floating-body resistor.

Also, the main channel portion of the semiconductor channel of the DDSOI MOSFETs can includes a channel body-contact portion adjacent the gate body-contact portion of the gate conductor, and a channel floating-body portion adjacent the gate floating-body portion of the gate conductor. In such a situation, a body-tab sub-transistor of the DDSOI MOSFETs includes the gate isolation portion of the gate conductor and the channel isolation portion of the semiconductor channel. In view of this, the simulation circuit is produced by the processor to include a body-tab sub-transistor simulation (that simulates the body-tab sub-transistor of the DDSOI MOSFETs) that includes the gate isolation resistor, the isolation body resistor, and the isolation transistor. Activation of the isolation transistor, combined with deactivation of the body-contact transistor and floating-body transistor by the processor, provides body-tab simulation data from the body-tab sub-transistor simulation.

Also, a body-contact sub-transistor of the DDSOI MOSFETs can include the gate body-contact portion of the gate conductor and the main channel portion of the semiconductor channel. Therefore, the simulation circuit is produced by the processor to include a body-contact sub-transistor simulation (that simulates the body-contact sub-transistor of the DDSOI MOSFETs) that includes the gate body-contact resistor, the main body resistor, and the body-contact transistor. Activation of the body-contact transistor, combined with deactivation of the isolation transistor and floating-body transistor by the processor, provides body-contact simulation data from the body-contact sub-transistor simulation.

Additionally, a floating-body sub-transistor of the DDSOI MOSFETs can include the gate floating-body portion of the gate conductor and the channel floating-body portion of the semiconductor channel. Thus, the simulation circuit is produced by the processor to include a floating-body sub-transistor simulation (that simulates the floating-body sub-transistor of the DDSOI MOSFETs) that includes the gate floating-body resistor and the floating-body transistor. Activation of the floating-body transistor, combined with deactivation of the isolation transistor and body-contact transistor by the processor, provides floating-body simulation data from a floating-body sub-transistor simulation.

The testing system is capable of generating test data by supplying the test inputs to the DDSOI MOSFETs and measuring output of the DDSOI MOSFETs. After this, the processor is capable of comparing the simulated data to the test data to identify data differences. Also, the designer input module is capable of receiving iterative changes to a design of the DDSOI MOSFETs to reduce the data differences. Therefore, the processor and the testing system are capable of repeating the processes of generating test data, comparing, and changing the design, until the data differences are within a threshold to produce a final design. Also, the processor is capable of outputting this final design for manufacturing of the DDSOI MOSFETS.

BRIEF DESCRIPTION OF THE DRAWINGS

The embodiments herein will be better understood from the following detailed description with reference to the drawings, which are not necessarily drawn to scale and in which:

FIG. 12 is a schematic diagram illustrating aspects of systems herein; and

DETAILED DESCRIPTION

Figure 1:
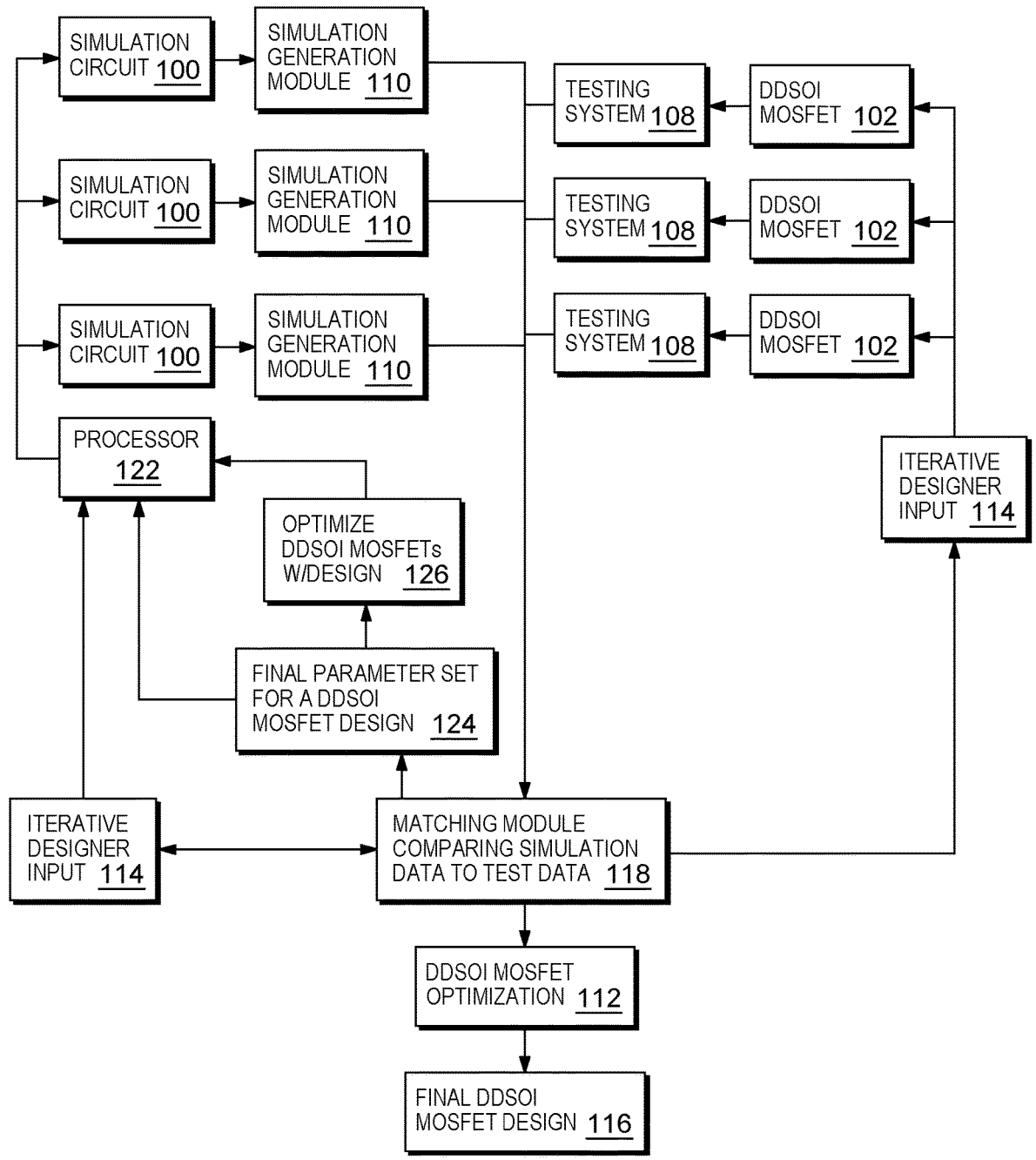
FIG. 1 is a schematic diagram illustrating systems herein.

As mentioned above, accurate modeling of the body impedance of dynamically depleted devices can be very complicated, yet such modeling is useful to enable the designer to explore the full potential of such technology. The systems and methods herein address such issues using a circuit simulation and a methodology to predict floating-body effects and RF nonlinearity in any type of body-contacted DDSOI MOSFETs. This includes floating-body effects including Gds ($\partial Id/\partial Vd$) kink, high drain bias threshold voltage lowering and breakdown, etc. Further, the methods and systems herein provide proper distribution of the gate charge (over the body-contact isolation region) among source and drain terminals, to get the correct bias dependence for overlap and gate capacitances. Also, these methods provide correct behavior of output trans-conductance characteristics (Gm=$\partial Id/\partial Vg$), impact ionization, and diode current prediction without any "unphysical" model parameter values, as well as frequency response of Gds, Gm, parasitic capacitances and body impedance.

Generally, the systems herein can generate and refine a simulation circuit of a transistor (by comparing the simulated output of the simulation circuit with output from physically tested transistors) so that the simulation circuit accurately produces output that matches the output of corresponding physical transistors. After one or more of such refined, highly accurate simulation circuits have been created, the systems and methods can use the simulation circuits to evaluate how closely the performance of other physical transistors matches the refined simulation circuit. This allows designers to make changes to the physical transistors, in iterative processing, to technically improve the operating performance of the physical transistors (by adjusting the parameter set of the physical transistors) to generate output that more closely matches that of the refined simulation circuit.

Dynamically depleted transistors can conceptually include "sub-transistors" because portions of dynamically depleted transistors have isolation characteristics, other portions have body-contacted characteristics, other portions have floating-body characteristics, etc. Therefore, the simulation circuits produced herein include multiple transistors that isolate the performance of the various sub-transistors within the overall transistor. This allows the designer to individually tune each sub-transistor within the transistor design by adjusting transistor design characteristics such as doping concentrations, device lengths, device widths, etc., as they are reflected in the simulation circuit. The individual sub-transistor tuning afforded by these systems and methods permits transistor designs to be adjusted in a more precise manner. Further, by matching the tested output of actual physical transistors to the simulation circuit, the systems and methods herein allow the simulations generated using the simulation circuit to become very accurate in predicting how individual changes to each sub-transistor will affect the performance of the transistor as a whole. In this way, the systems and methods herein improve the transistor technology by allowing transistors to achieve various technical improvements, such as operating faster, using less power, generating higher output, etc.

FIG. 1 illustrates one exemplary system herein that includes a designer input module 114 (user input) that is capable of receiving characteristics of DDSOI MOSFETs 102, a processor 122 that is capable of producing a simulation circuit 100 or test structure (that simulates characteristics of the DDSOI MOSFETs 102, and can be an actual physical circuit, or a simulation within software) and is in communication with the designer input module 114, and a testing system 108 (measurement system) capable of being physically connected to the DDSOI MOSFETs 102. The processor 122 produces the simulation circuit 100 (some examples of which are shown in FIGS. 4A-4C, to which reference is made in the discussion of FIG. 1) to include an isolation body resistor 147R (representing the resistance of the channel (body) isolation portion of the DDSOI MOSFETs 102), a main body resistor 148R (representing the resistance of the main channel portion of the DDSOI MOSFETs 102), an isolation transistor 176 connected to the isolation body resistor 147R, and a body-contact transistor 178 connected to the main body resistor 148R. Further details of the DDSOI MOSFETs and simulation circuit 100 are discussed below with respect FIGS. 2-7.

More specifically, when producing the simulation circuit 100, the processor 122 is capable of performing a model extraction process to establish characteristics of the isolation body resistor 147R and the main body resistor 148R, the isolation transistor 176, the body-contact transistor 178, etc., shown in FIG. 4A using the characteristics of the DDSOI MOSFETs 102 and other designer input 114. These characteristics of the DDSOI MOSFETs 102 include, for example, transistor current, transistor voltage, transistor length, and transistor width of the DDSOI MOSFETs 102. Different characteristics of the DDSOI MOSFETs 102 change aspects of the simulation circuit 100 produced by the model extraction process.

The main gate portion of the DDSOI MOSFETs 102 can include a gate body-contact portion adjacent the gate isolation portion, and a gate floating-body portion distal to the gate isolation portion (as discussed below with respect to FIGS. 2-3C). Thus, the simulation circuit 100 that is produced by the processor 122 can further include a gate isolation resistor 194R (representing the resistance of the gate isolation portion of the DDSOI MOSFETs 102) that is connected to the body isolation transistor 176, a gate body-contact resistor 195R (representing the resistance of the gate body-contact portion of the DDSOI MOSFETs 102) that is connected to the body-contact transistor 178, a gate floating-body resistor 196R (representing the resistance of the gate floating-body portion of the DDSOI MOSFETs 102), and a floating-body transistor 180 that is connected to the gate floating-body resistor 196R. The simulation generation module 110 is capable of generating simulated data by supplying test inputs to the simulation circuit 100, while selectively activating either the isolation transistor 176 or the body-contact transistor 178 or the floating body transistor 180.

Similarly, the main channel portion of the semiconductor channel of the DDSOI MOSFETs 102 can include a channel body-contact portion adjacent the gate body-contact portion of the gate conductor, and a channel floating-body portion adjacent the gate floating-body portion of the gate conductor. In such a situation, a body-tab sub-transistor of the DDSOI MOSFETs 102 includes the gate isolation portion of the gate conductor and the channel isolation portion of the semiconductor channel. In view of this, the simulation circuit 100 is produced by the processor 122 to include a body-tab sub-transistor simulation portion 130 (that simulates the body-tab sub-transistor of the DDSOI MOSFETs 102) and this includes the gate isolation resistor 194R, the isolation body resistor 147R, and the isolation transistor 176. Activation of the isolation transistor 176, combined with deactivation of the body-contact transistor 178 and floating-body transistor 180 by the simulation generation module 110, provides body-tab simulation data from the body-tab sub-transistor simulation portion 130.

In the same way, a body-contact sub-transistor of the DDSOI MOSFETs 102 can include the gate body-contact portion of the gate conductor and the main channel portion of the semiconductor channel. Therefore, the simulation circuit 100 is produced by the processor 122 to include a body-contact sub-transistor simulation portion 132 (that simulates the body-contact sub-transistor of the DDSOI MOSFETs 102) and this includes the gate body-contact resistor 195R, the main body resistor 148R, and the body-contact transistor 178. Activation of the body-contact transistor 178, combined with deactivation of the isolation transistor 176 and floating-body transistor 180 by the simulation generation module 110, provides body-contact simulation data from the body-contact sub-transistor simulation portion 132.

Additionally, a floating-body sub-transistor of the DDSOI MOSFETs 102 can include the gate floating-body portion of the gate conductor and the channel floating-body portion of the semiconductor channel. Thus, the simulation circuit 100 is produced by the processor 122 to include a floating-body sub-transistor simulation portion 134 (that simulates the floating-body sub-transistor of the DDSOI MOSFETs 102) and this includes the gate floating-body resistor 196R and the floating-body transistor 180. Activation of the floating-body transistor 180, combined with deactivation of the isolation transistor 176 and body-contact transistor 178 by the simulation generation module 110, provides floating-body simulation data from a floating-body sub-transistor simulation portion 134.

Therefore, selective activation of the isolation transistor 176, the body-contact transistor 178, or the floating-body transistor 180 by the simulation generation module 110 restricts which resistor in the simulation circuit 100 receives the test inputs, so as to produce independent simulated data for the different sub-transistors that make up the DDSOI MOSFETs 102.

The testing system 108 is capable of generating test data by supplying the test inputs to the DDSOI MOSFETs 102 and measuring output of the DDSOI MOSFETs 102. After this, the matching module 118 is capable of comparing the simulated data to the test data to identify data differences. Also, the designer input module 114 is capable of receiving iterative changes 114 to simulation of the test circuit 100 to reduce the data differences for a particular design of DDSOI MOSFET design 102. This iterative process 114 is repeated until the differences are within a pre-determined threshold. This allows the test circuit 100, along with final set of model parameters 124, to be used to optimize circuits 126 (for optimizing a large number of the same designed DDSOI MOSFETs).

Therefore, a given DDSOI MOSFET 102 design can be optimized by iteratively repeating the processes of generating test data 108, and comparing the test data from test circuit 100 with the simulation from the simulation generator 110. In such processing, the processor 122 takes input from the final parameter set for a DDSOI MOSFET design 124, and the iterative designer input 114 changes the DDSOI MOSFET 102 design, until the test data from the testing systems 108 aligns with intended performance for a targeted application in the matching module 118, to produce a final design 116 (after optimization 112). Thus, the matching module 118 is capable of outputting different products: the final model parameter set 124 along with a simulation circuit 100 for a particular DDSOI design; as well as the final design 116 for manufacturing of the DDSOI MOSFETS 102.

Figure 2:
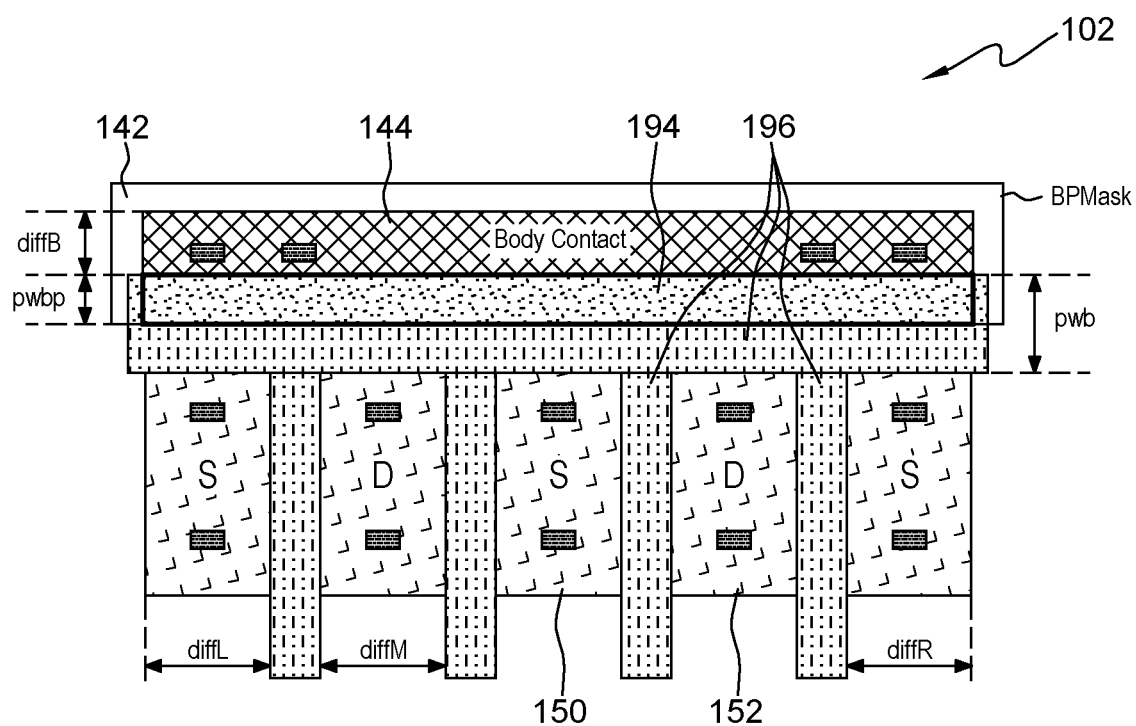
FIG. 2 is a schematic top (plan) view of transistors according to embodiments herein.
Figure 3A:
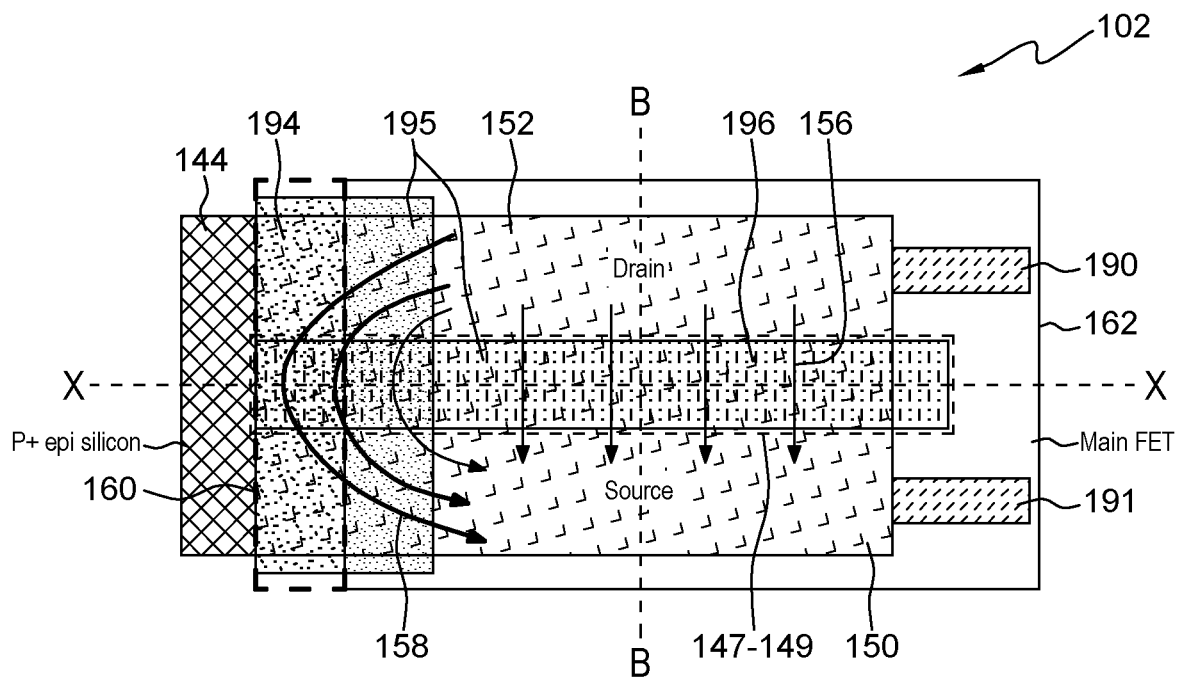
FIG. 3A is a schematic top (plan) view of transistors according to embodiments herein.

With the overall system as shown in FIG. 1 in place, more specific discussion of some examples are presented in FIGS. 2-4C. Specifically, FIGS. 2 and 3A are top (plan) views of DDSOI MOSFETs 102 (a view from a direction perpendicular to the underlying substrate). FIGS. 3B-3C are cross-sectional views of the structure shown in FIG. 3A, along line X-X. FIG. 2 illustrates multiple DDSOI MOSFETs 102 adjacent one another, and FIG. 3A illustrates a single one of those DDSOI MOSFETs 102.

Figure 3B:
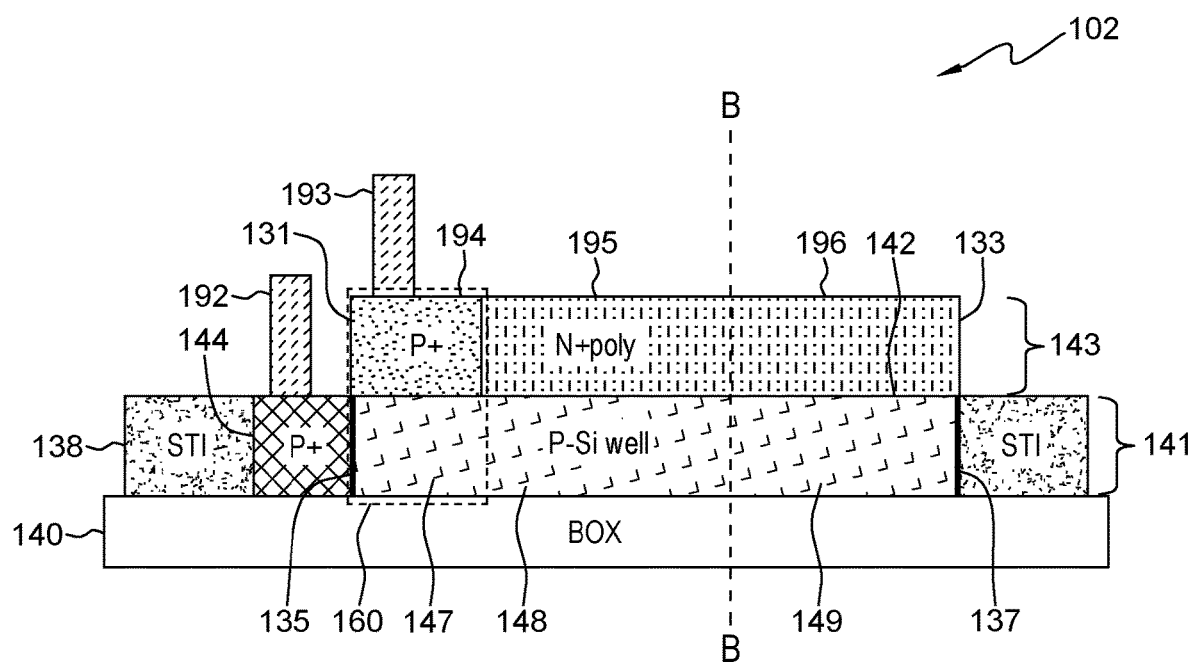
FIGS. 3B-3C are cross-sectional views of the structure shown in FIG. 3A.
Figure 3C:
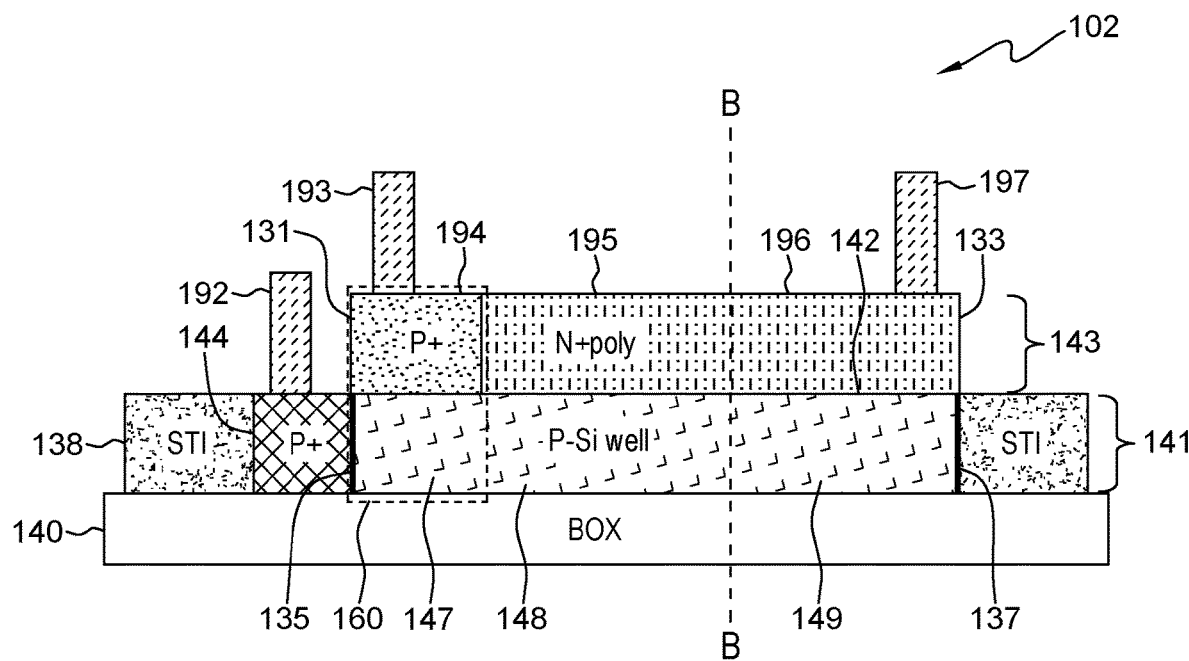
Figure 4A:
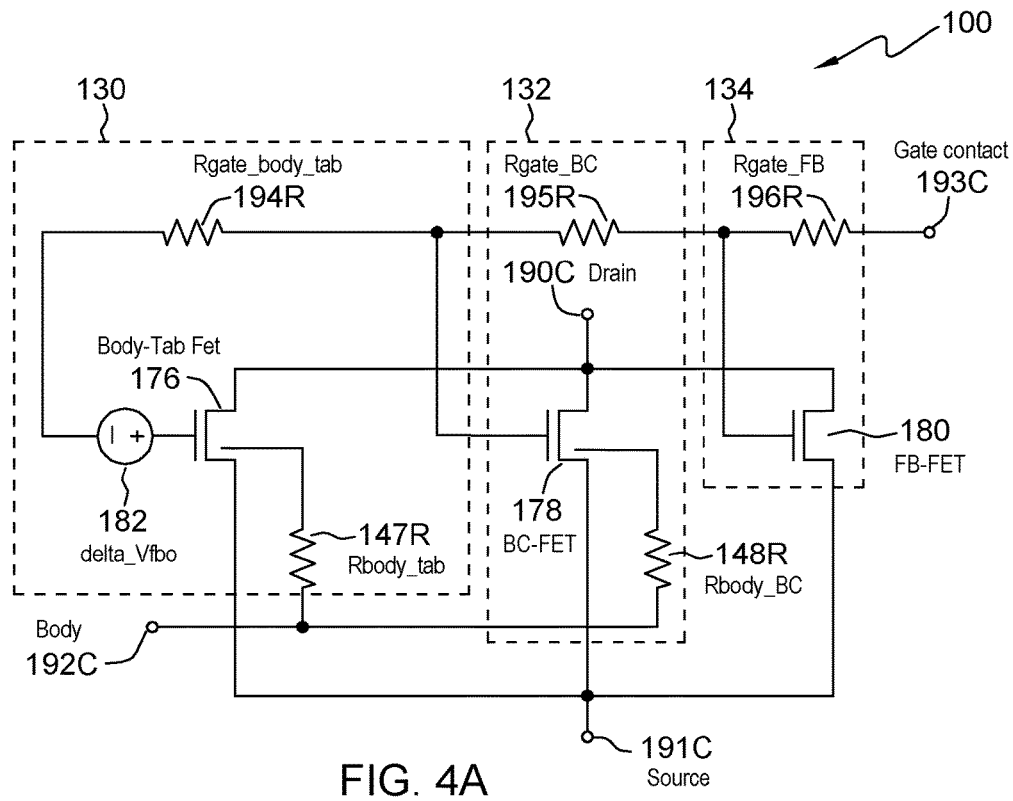
FIGS. 4A-4C are schematic diagrams illustrating simulation circuits herein.
Figure 4B:
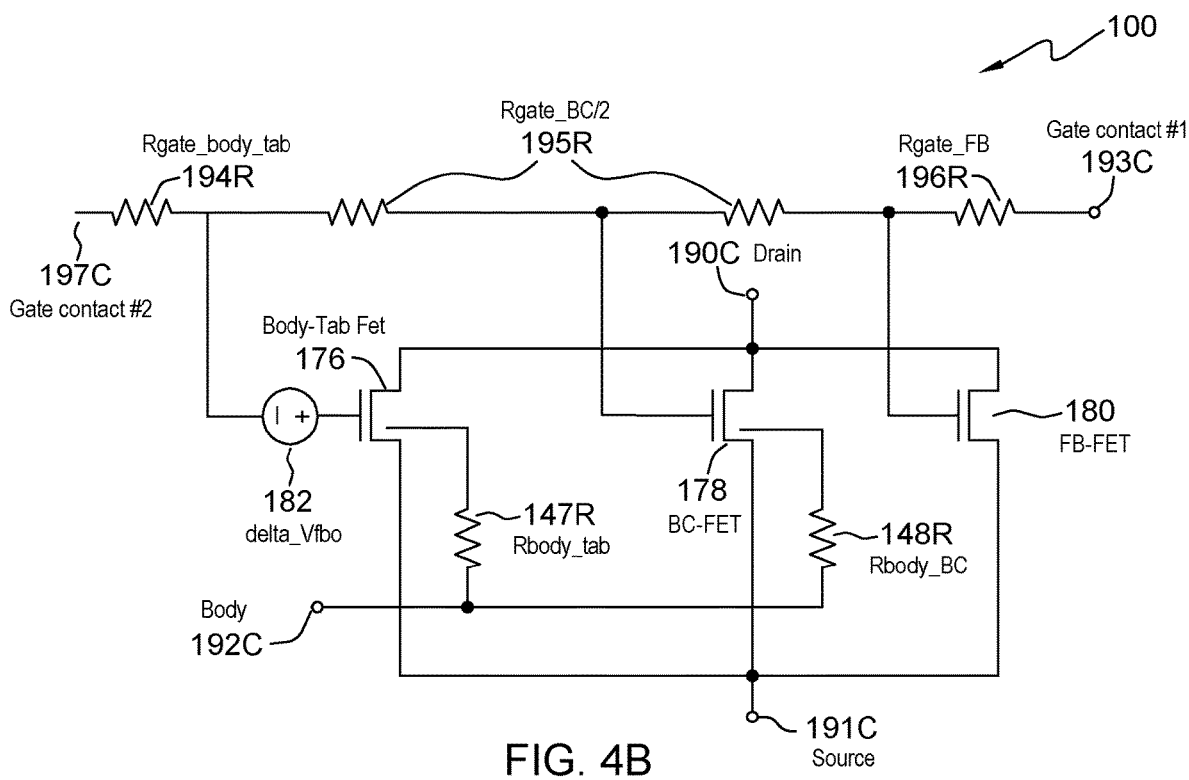
Figure 4C:
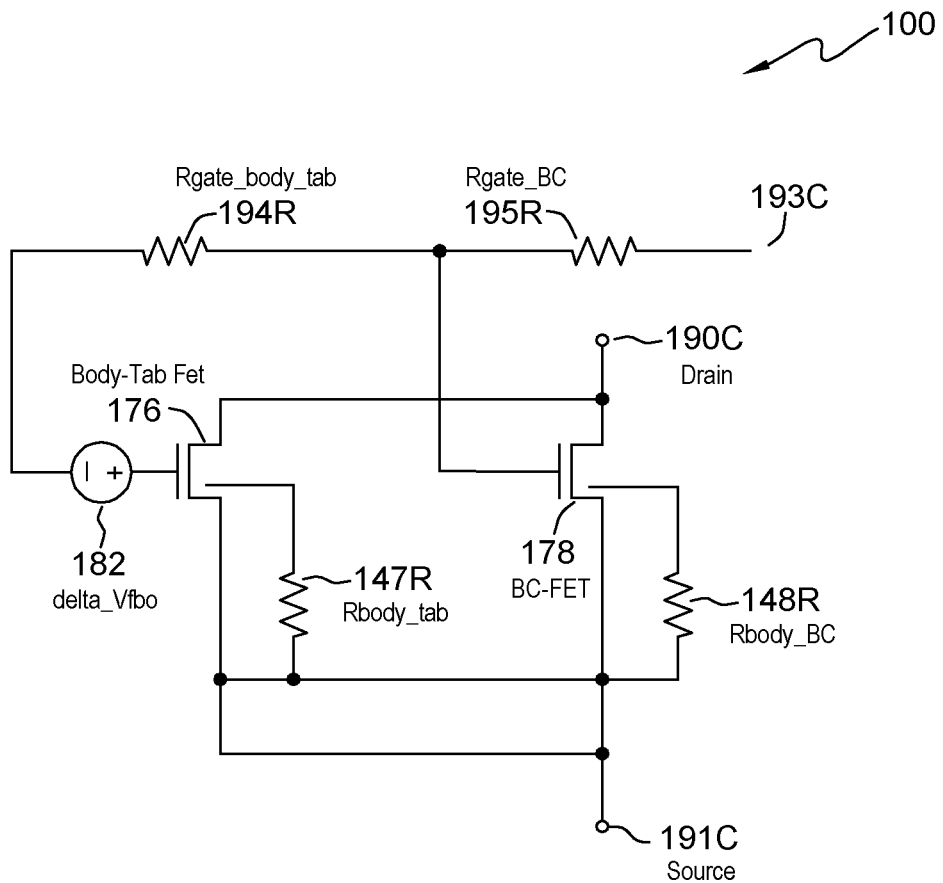

As shown in FIGS. 2-3C, each of the differently designed DDSOI MOSFETs 102 includes a buried oxide layer 140, a body layer 141 on (contacting) the buried oxide layer 140, an insulator layer 142 on (contacting) the body layer 141, and a second layer 143 on (contacting) the insulator layer 142 (all of which are parallel to one another). More specifically, as shown in FIG. 3B, the body layer 141 is between the buried oxide layer 140 and the insulator layer 142, and the insulator layer 142 is between the body layer 141 and the second layer 143.

The various components of the differently designed DDSOI MOSFETs 102 include a semiconducting channel 147-149 in the body layer 141. One or more body-contact elements 144 are located at one or more ends 135, 137 of the semiconducting channel 147-149 in the body layer 141, a conductive source element 150 and a conductive drain element 152 on opposite sides of the semiconducting channel 147-149 in the body layer 141, and a gate conductor 194-196 in the second layer 143. Source/drain contacts are schematically shown as items 190, 191 in FIG. 3A, but in the final design could be located in other positions. Note that, as described in greater detail below, the gate conductor has a first portion in the isolation region 194, and the remainder of the gate conductor is divided into a body-contact portion 195 and a floating portion 196 (that are divided by dashed line B-B in the drawings).

Additionally, shallow trench isolation regions (STI) 138 are laterally adjacent to the semiconducting channel 147-149, or body-contact elements 144 (if present). FIGS. 3B-3C illustrate the contact to the body-contact element 144 using identification numeral 192. Note that in FIG. 3A, the location of the semiconducting channel 147-149 is shown using a dashed box, because the semiconducting channel 147-149 is below the gate conductor 194-196 (as shown in FIGS. 3B-3C). More specifically, the gate conductor 194-196 is positioned in the second layer 143 across the insulator layer 142 from the channel 147-149 in the body layer 141.

The gate conductor 194-196 has ends 131, 133; a main region 195, 196 between the ends 131, 133; and a differently doped isolation region 194 located at one or more of the ends (end 131 in the example shown in FIG. 3B). Electrical contacts can be made on one or both ends of gate conductor (at 131 or at 133 or at both). Therefore, FIG. 3B illustrates a single gate contact 193 connected to the isolation region 194 of the gate conductor; while, FIG. 3B illustrates gate contact 193 and a second gate contact 197 connected to the floating-body portion 196 of the gate conductor.

For example, the main region 195, 196 of the gate conductor could have an opposite polarity doping (N-type vs. P-type) from the isolation region 194 of the gate conductor; and, in the example shown in FIGS. 3B-3C, the main region 195, 196 has N+ type doping, while the isolation region 194 has P+ doping. More specifically, an isolation region mask (P+ mask) is used to apply P+ doping, and the area not covered by the BP mask receives N+ doping.

The semiconducting channel 147-149 has a body-contact region 148 and a floating region 149 between the ends 135, 137. The semiconducting channel 147-149 also has one or more body-tab regions 147 positioned at one or more of the ends (e.g. end 135 in the example shown in FIG. 3B) of the semiconducting channel 147-149, and the one or more body-tab regions 147 are doped differently from the body-contact region 148 and the floating region 149. The isolation region(s) 194 of the gate conductor are positioned across the insulator layer 142 from the body-tab regions 147 of the semiconducting channel, and the main region 195, 196 of the gate conductor is positioned across the insulator layer 142 from the body-contact region 148 and the floating region 149 of the semiconducting channel.

Note that the body-contact elements 144 are, like the gate conductor 194-196, electrically conductive, and this promotes the indirect electrical biasing with the body-tab regions 147. However, as the distance from the body-contact elements 144 increases along the body layer 141, the bias of the body layer 141 decreases, and this is referred to as distributive body impedance.

Arrows 156, shown in FIG. 3A, illustrate the main drain to source fields, while arrows 158 illustrate the lateral drain to source fields. The current is proportional to the fringe field lines penetrating under the P+ gate conductor region (red lines), characterized by fringe field distribution (Fr). Additionally, box 162 in FIG. 3A outlines the main FET, while dashed box 160 outlines the body-tab FET. The body-tab FET 160 is the region of P+ over P−, i.e. body-contact isolation area, and has a different flat band voltage (VFB) than main FET 162. The body-tab FET 160 is also referred to as the body-contact isolation area. Although the entire area enclosed by box 160 will respond to a small signal input, only a portion of it will contribute to current.

The different doping of the gate conductor 194-196, and the distributive impedance of the body layer 141 from the body-contact element(s) 144 creates three distinct regions of the semiconducting channel: the body-tab regions 147, which experiences the most biased body effects (lowest resistance); the body-contact region 148, which experiences less biased body effects than the body-tab regions 147 (more resistance); and the floating region 149, which experiences even less biased body effects than the body-contact region 148 (or possibly no bias effects, the most resistance). Thus, due to the distributive body impedance, some part of the FET 102 will have a "floating-body" nature (FB-FET 149), some part will have a "body-contacted" nature (BC-FET 148), and some part will be the body-tab FET 147 (160), which has a with very low body resistance and different flat band voltage.

The differently designed DDSOI MOSFETs 102 have different doping concentrations in, and/or differently sized, body-contact elements 144, gate conductor 194-196, source element 150, channel 147-149, drain element 152, etc. Such different doping concentrations and sizes of the other differently designed DDSOI MOSFETs 102 will cause the transistors to produce different outputs for the same input.

The methods and systems herein characterize the body-tab FET 160 and create the simulation circuit 100, as shown in FIGS. 4A-4C (discussed below). More specifically, FIG. 4A illustrates a simulation (test) circuit 100 for use with a single gate contact 193 (corresponding to FIG. 3B), while FIG. 4B illustrates a test circuit 100 for use with a two gate contacts 193, 197 (corresponding to FIG. 3C).

As noted above in the description of FIG. 1, when producing the simulation circuit 100, the processor 122 is capable of performing a model extraction process to establish characteristics of the isolation body resistor 147R and the main body resistor 148R, the isolation transistor 176, the body-contact transistor 178, etc., shown in FIGS. 4A-4C using the characteristics of the DDSOI MOSFETs 102 and other designer input 114. These characteristics of the DDSOI MOSFETs 102 include, for example, transistor current, transistor voltage, transistor length, and transistor width of the DDSOI MOSFETs 102. Different characteristics of the DDSOI MOSFETs 102 change aspects of the simulation circuit 100 produced by the model extraction process.

As shown in FIGS. 3A-3C, the main gate portion of the DDSOI MOSFETs 102 can include a gate body-contact portion 195 adjacent the gate isolation portion 194, and a gate floating-body portion 196 distal to the gate isolation portion 194 (as discussed below with respect to FIGS. 2-3C). Thus, the simulation circuit 100 that is produced by the processor 122 can further include a gate isolation resistor 194R (representing the resistance of the gate isolation portion 194 of the DDSOI MOSFETs 102) that is connected to the body isolation transistor 176, a gate body-contact resistor 195R (representing the resistance of the gate body-contact portion 195 of the DDSOI MOSFETs 102) that is connected to the body-contact transistor 178, a gate floating-body resistor 196R (representing the resistance of the gate floating-body portion 196 of the DDSOI MOSFETs 102), and a floating-body transistor 180 that is connected to the gate floating-body resistor 196R. Again, the simulation generation module 110 is capable of generating simulated data by supplying test inputs to the simulation circuit 100, while selectively activating either the isolation transistor 176 or the body-contact transistor 178 or the floating body transistor 180.

Again, as shown in FIGS. 3A-3C, the main channel portion of the semiconductor channel of the DDSOI MOSFETs 102 can include a channel body-contact portion 148 adjacent the gate body-contact portion 195 of the gate conductor, and a channel floating-body portion 149 adjacent the gate floating-body portion 196 of the gate conductor. In such a situation, a body-tab sub-transistor of the DDSOI MOSFETs 102 includes the gate isolation portion 194 of the gate conductor and the channel isolation portion 147 of the semiconductor channel. In view of this, the simulation circuit 100 is produced by the processor 122 to include a body-tab sub-transistor simulation portion 130 (that simulates the body-tab sub-transistor of the DDSOI MOSFETs 102) and this includes the gate isolation resistor 194R, the isolation body resistor 147R, and the isolation transistor 176.

Activation of the isolation transistor 176, combined with deactivation of the body-contact transistor 178 and floating-body transistor 180 by the simulation generation module 110, provides body-tab simulation data from the body-tab sub-transistor simulation portion 130.

In the same way, a body-contact sub-transistor of the DDSOI MOSFETs 102 can include the gate body-contact portion 195 of the gate conductor and the main channel portion of the semiconductor channel. Therefore, the simulation circuit 100 is produced by the processor 122 to include a body-contact sub-transistor simulation portion 132 (that simulates the body-contact sub-transistor of the DDSOI MOSFETs 102) and this includes the gate body-contact resistor 195R, the main body resistor 148R, and the body-contact transistor 178. Activation of the body-contact transistor 178, combined with deactivation of the isolation transistor 176 and floating-body transistor 180 by the simulation generation module 110, provides body-contact simulation data from the body-contact sub-transistor simulation portion 132.

Additionally, a floating-body sub-transistor of the DDSOI MOSFETs 102 can include the gate floating-body portion 196 of the gate conductor and the channel floating-body portion 149 of the semiconductor channel. Thus, the simulation circuit 100 is produced by the processor 122 to include a floating-body sub-transistor simulation portion 134 (that simulates the floating-body sub-transistor of the DDSOI MOSFETs 102) and this includes the gate floating-body resistor 196R and the floating-body transistor 180. Activation of the floating-body transistor 180, combined with deactivation of the isolation transistor 176 and body-contact transistor 178 by the simulation generation module 110, provides floating-body simulation data from a floating-body sub-transistor simulation portion 134.

Therefore, selective activation of the isolation transistor 176, the body-contact transistor 178, or the floating-body transistor 180 by the simulation generation module 110 restricts which resistor in the simulation circuit 100 receives the test inputs, so as to produce independent simulated data for the different sub-transistors that make up the DDSOI MOSFETs 102.

Again, the testing system 108 is capable of generating test data by supplying the test inputs to the DDSOI MOSFETs 102 and measuring output of the DDSOI MOSFETs 102. After this, the matching module 118 is capable of comparing the simulated data to the test data to identify data differences. Also, the designer input module 114 is capable of receiving iterative changes 114 to simulation of the test circuit 100 to reduce the data differences for a particular design of DDSOI MOSFET design 102. This iterative process 114 is repeated until the differences are within a pre-determined threshold. This allows the test circuit 100, along with final set of model parameters 124, to be used to optimize circuits 126 (for optimizing a large number of the same designed DDSOI MOSFETs).

These methods and systems distribute the widths of the body-contact FET 148 and floating-body FET 149, such that W_BC+W_FB=Wdrawn+$\Delta$WBC. Additionally, iterative model extraction is performed for the body-contact FET 148 and floating-body FET 149 using model parameters, W_BC and W_FB, to predict floating-body effects, body current, and frequency response. Gate resistance (Rg) connections and values are layout specific, dependent on the gate contact position, and gate polysilicon (conductor) pattern (e.g. T-gate, H-gate).

The transistors 176, 178, 180 of the simulation circuit 100 allow the methods and systems herein to simulate the differently designed DDSOI MOSFETs 102 by selectively activating the body-contact transistors 178, the floating-body transistor 180, or the body-tab transistors 176, potentially one at a time while varying voltage and frequency inputs to the gate conductor contact 193C of the circuit; the source/drain elements contacts 191C, 190C of the circuit; and the body-contact element contact 192C of the circuit, to simulate floating-body effects test results, body current test results, and frequency response test results of each of the differently designed DDSOI MOSFETs 102. Thus, the designer can selectively connect a different transistor in the simulation generation module 110, by turning off each of the transistors 176, 178, 180, to evaluate their simulated characteristic; and this simulates the measured data for the actual DDSOI MOSFET 102. In one example, the designer turns off specific transistors by setting mobility to zero, or disconnecting the drain or gate connection, etc. This corresponds with the module 110 discussed above, where the designer simulates transistors 176, 178, and 180, or the test circuit 100, to match the electrical characteristics of each different DDSOI MOSFET 102, to optimize the device for different applications.

Note that element 182 in FIGS. 4A-4C is a voltage source element of the simulation circuit 100, where Delta_vfbo is the difference in the flat band voltage between P+ and N+ polysilicon gate. More specifically, item 180 adds body-contact bias to the gate of transistor 176 (which corresponds to the difference in the flat band voltage of P+ and N+ gate conductor), which in turn produces different electrical characteristic from the main FET 162.

This testing with the simulation circuit 100, in turn, allows the simulation generation module 110 to produce a simulation model that predicts performance of any DDSOI MOSFET designs submitted to the simulation model using the floating-body effects test results, the body current test results, and the frequency response test results obtained when testing the differently designed DDSOI MOSFETs 102.

As noted above, FIG. 4A illustrates a simulation (test) circuit 100 for use with a single gate contact 193 (corresponding to FIG. 3B), while FIG. 4B illustrates a test circuit 100 for use with a two gate contacts 193, 197 (corresponding to FIG. 3C). Therefore, the simulation circuit in 4B includes two gate body-contact resistors 195R, and two circuit contacts 193C, 197C, but is otherwise similar to the simulation circuit shown in FIG. 4A. FIG. 4C illustrates the simulation circuit for a H-gate structure, which similarly includes body-contact transistor 178, body-tab transistor 176, gate conductor contact 193C, source/drain elements contacts 191C, 190C, body-contact element contact 192C, isolation body resistor 147R, main body resistor 148R, isolation transistor 176, and body-contact transistor 178.

The simulation circuits 100 allow the differently designed DDSOI MOSFETs 102 to be simulated by selectively activating the body-contact transistors 178, the floating-body transistor 180, or the body-tab transistors 176, potentially one at a time while varying voltage and frequency inputs to the gate conductor contact 193C; the source/drain elements contacts 191C, 190C; and the body-contact element contact 192C, to simulate floating-body effects test results, body current test results, and frequency response test results of each of the differently designed DDSOI MOSFETs 102.

Figure 5:
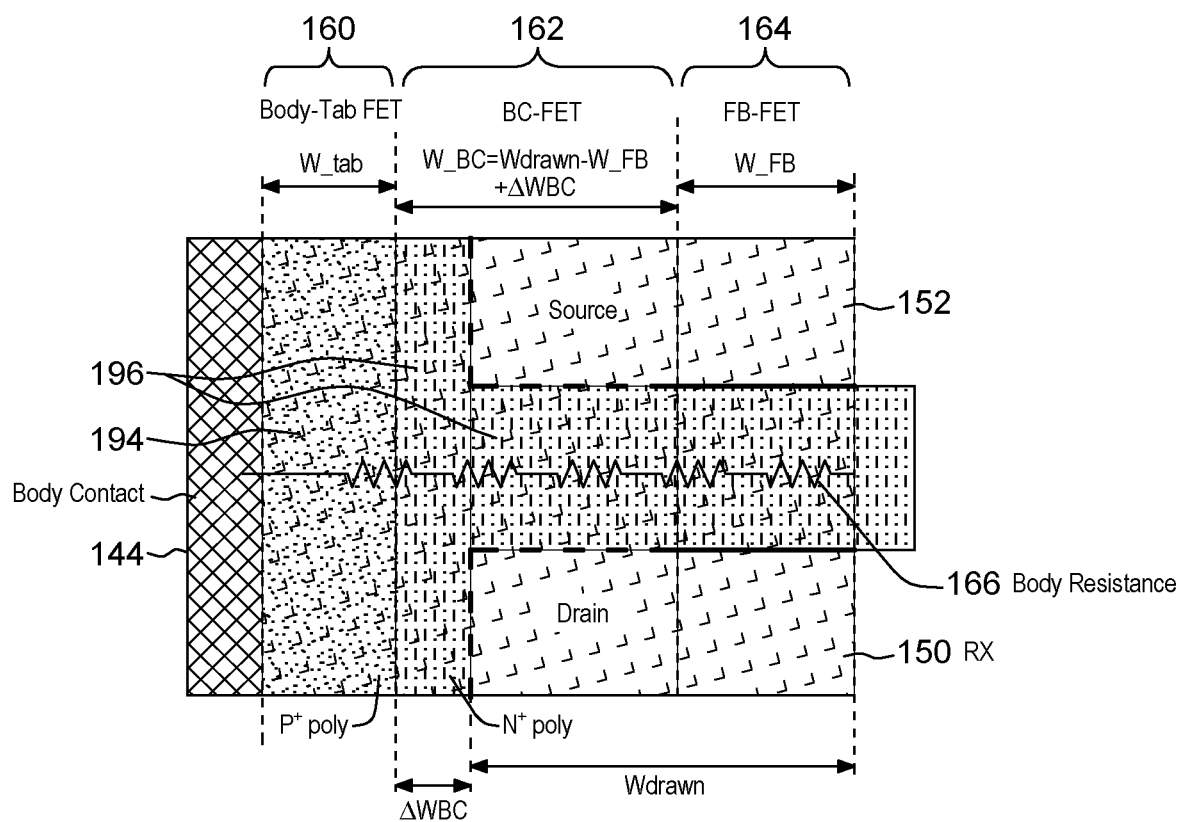
FIGS. 5-8 are schematic top (plan) views of transistors according to embodiments herein.
Figure 6:
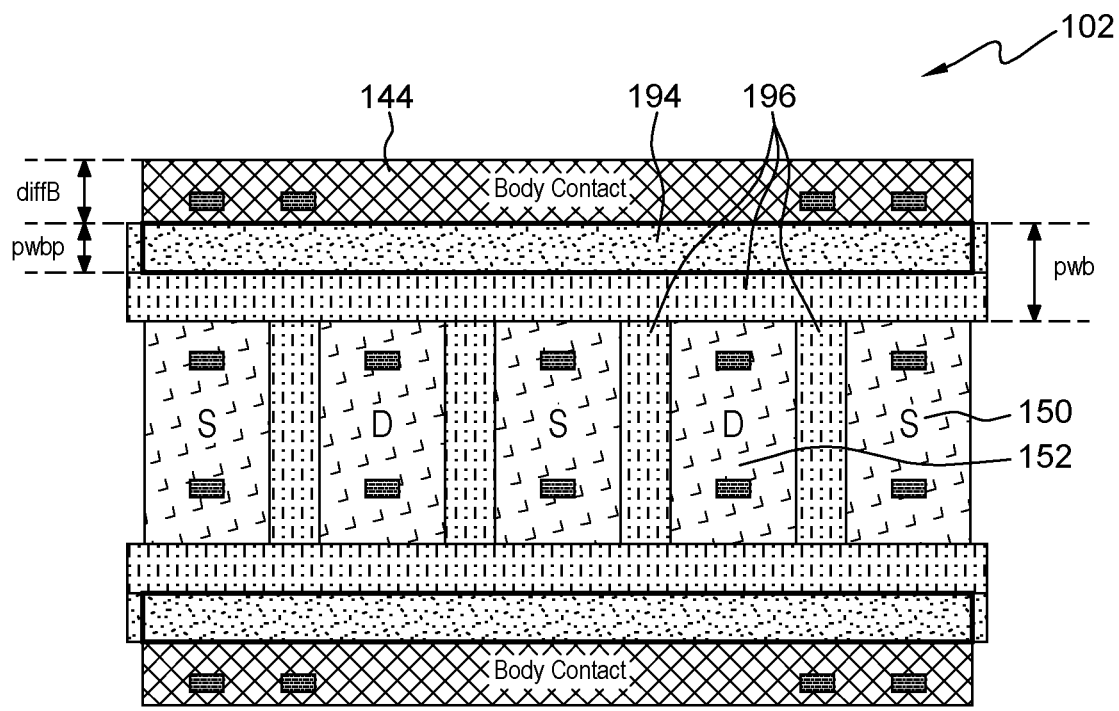
Figure 7:
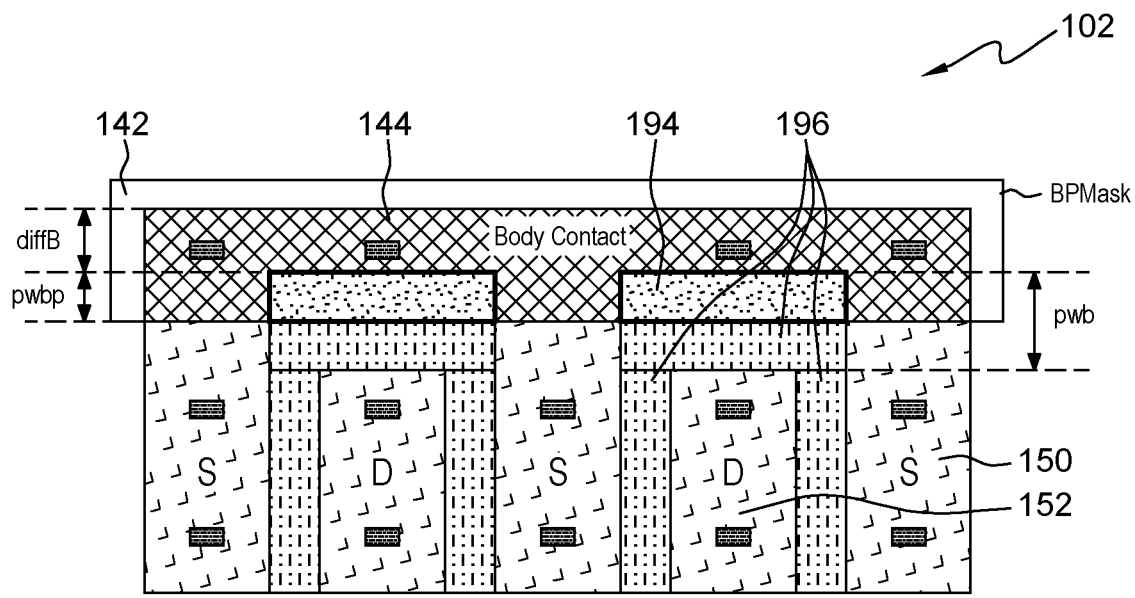

FIG. 5 illustrates a DDSOI MOSFETs 102 that is similar to that shown in FIG. 3A (and the same numbers are used to identify the same features); however, FIG. 5 illustrates that the different sub-transistors formed within the DDSOI MOSFETs 102 include the body-tab FET 160, the body-contact FET 162, and the floating-body FET 164. Further, such sub-transistors include portions of the source, drain, channel, gate oxide, gate conductor, body, etc., of the DDSOI MOSFETs 102 which act as each different sub-transistor's source, drain, channel, gate oxide, gate conductor, body, etc. FIG. 5 also illustrates the body resistance 166 schematic representation as a resistor. The impact ionization and diode current of body-tab sub-FET 160 and body-contact sub-FET 162 are collected through the body-contact 144 (where the junction is shown by the dotted line in item 162); however, in the floating-body sub-FET 164, the impact ionization and diode current is not collected through the body-contact 144 (because it is floating, and not biased by the body).

Figure 8:
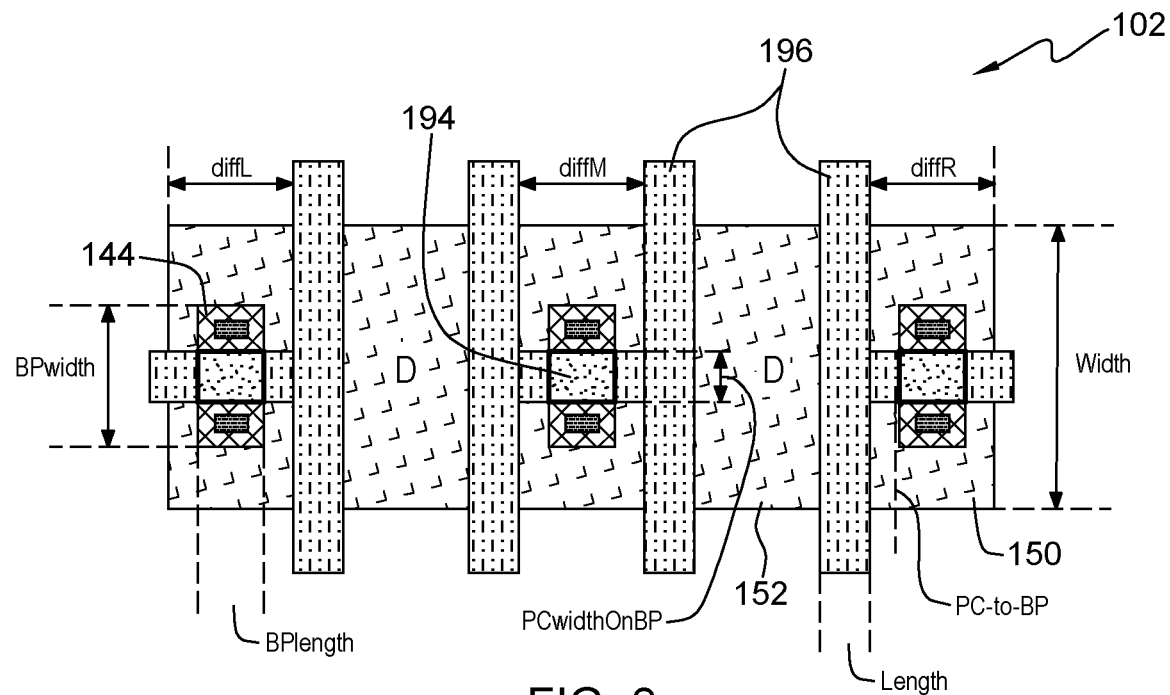

In different exemplary structures, the gate conductor 194-196 can be a T-shaped structure (FIG. 2), an I-shaped structure (FIG. 6), an L-shaped structure (FIG. 7), an H-shaped structure (FIG. 8), etc., when the second layer 143 is viewed from a direction perpendicular to the second layer 143 (when viewed from the top). Note again that all drawings herein use the same numbers to identify the same features.

This testing with the simulation circuit, in turn, allows the simulation generation module to produce a simulation model that predicts performance of any DDSOI MOSFET designs submitted to the simulation model using the floating-body effects test results, the body current test results, and the frequency response test results obtained when testing the differently designed DDSOI MOSFETs.

Figure 9:
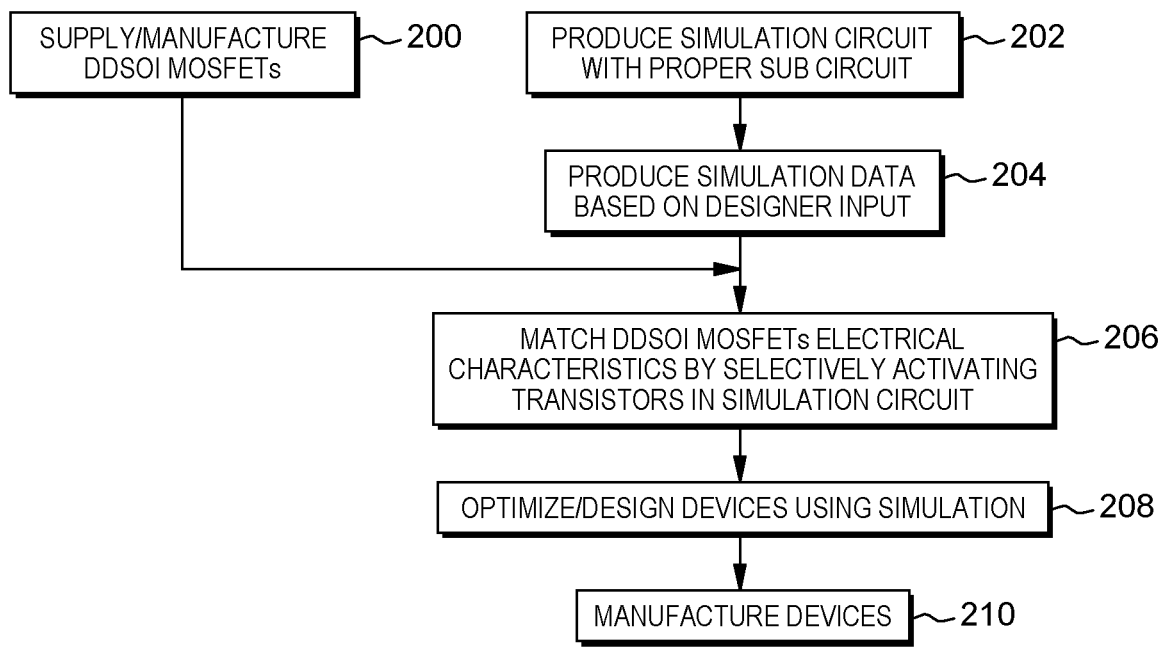
FIGS. 9 and 10 are flow diagrams illustrating embodiments herein.

The flowcharts in FIGS. 9 (more generally) and 10 (more specifically) illustrate processing steps herein. Referring to FIG. 9, the methods herein DDSOI MOSFETs can be manufactured or provided (supplied) in item 200, as described above. Again, the differently designed DDSOI MOSFETs have different doping concentrations in, and/or differently sized, body-contact elements, floating region, and/or the body-tab regions relative to each other; and such different doping concentrations and sizes of the differently designed DDSOI MOSFETs will cause the transistors to produce different outputs for the same input.

In order to test the DDSOI MOSFETs with the simulation circuit, in item 202, these methods produce the simulation circuit with the proper DDSOI MOSFET sub circuit by connecting one or more body-tab transistors of the simulation circuit to simulate resistance of the one or more body-tab regions of the semiconducting channel of the DDSOI MOSFET sub circuit, connect one or more body-contact transistors of the simulation circuit to simulate resistance of the body-contact regions of the semiconducting channel of the DDSOI MOSFET sub circuit, and connect a floating-body transistor of the simulation circuit to simulate resistance of the floating regions of the semiconducting channel of the DDSOI MOSFET sub circuit. More specifically, this involves connecting the conductive drain element to drains of corresponding ones of the body-contact transistors, the floating-body transistor, and the body-tab transistors; and connecting the conductive source element to sources of corresponding ones of the body-contact transistors, the floating-body transistor, and the body-tab transistors.

In item 204, these methods produce a simulation that is based on designer input, as discussed above with respect to the DDSOI MOSFET simulation model 112. These transistors of the simulation circuit allow such methods to test the differently designed DDSOI MOSFETs, in item 206, by matching the DDSOI MOSFETs electrical characteristics by selectively activating the body-contact transistor(s), the floating-body transistor, and/or the body-tab transistor(s), while varying voltage and frequency inputs to the gate conductor and the source/drain elements, to determine floating-body effects test results, body current test results, and frequency response test results of each of the differently designed DDSOI MOSFETs.

In greater detail, resistance of the body-tab regions of the semiconducting channel to the isolation region of the gate conductor controls activation of the body-tab transistors; the resistance of the body-contact regions of the semiconducting channel to the main region of the gate conductor controls activation of the body-tab transistors; and the resistance of the floating regions of the semiconducting channel to the main region of the gate conductor controls activation of the floating-body transistor. Also note that, because of the foregoing transistor connections, the resistance of the body layer changes the bias of the body-tab transistor(s), and the resistance of the body-contact element changes the bias of the one or more body-contact transistor(s).

This testing with the simulation circuit, in turn, allows the simulation generation module to optimize and design devices using the simulation, in item 208, that predicts performance of any DDSOI MOSFET designs submitted to the simulation model using the floating-body effects test results, the body current test results, and the frequency response test results obtained when testing the differently designed DDSOI MOSFETs. Such devices are then manufactured, as shown in item 210.

Figure 10:
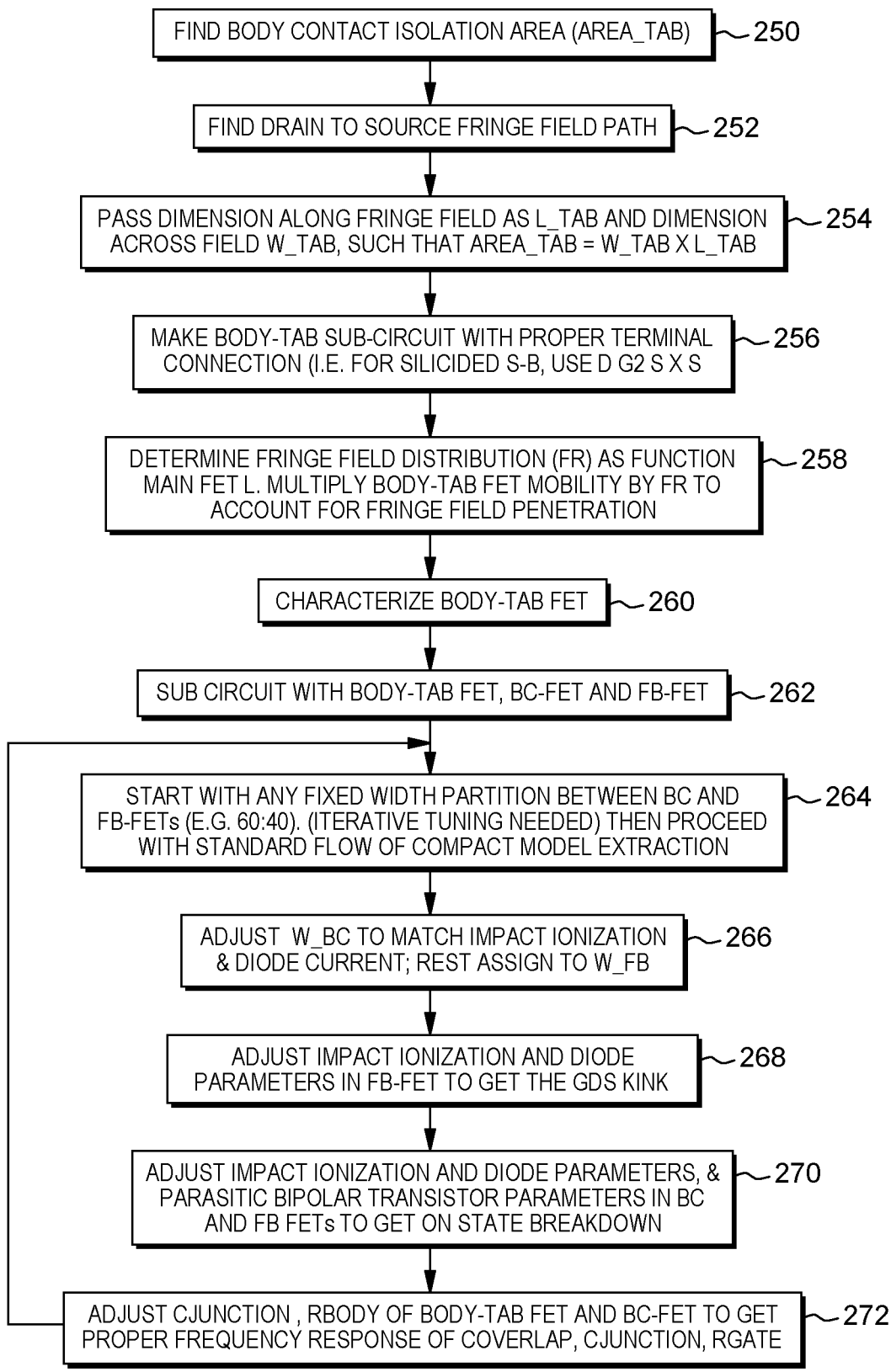

FIG. 10 illustrates one way in which a specific transistor design could be processed through the systems and methods herein; however, the embodiments herein are not limited to the example shown in FIG. 10, but are applicable to all DDSOI MOSFET designs, and all different types of components thereof. More specifically, FIG. 10 shows that, in item 250, these methods find the body-contact isolation area (area_tab) of the transistors being tested. Next, in item 252, the methods herein find the drain to source fringe field path of the transistors being tested. Additionally, in order to determine charge partition and junction current, in item 254, these methods pass the dimension along the fringe field as L_tab (the length of the tab) and the dimension across field W_tab (the width of the tab), such that area_tab=W_tab× L_tab. Also, in item 256, processing herein makes the body-tab sub-circuit (such as item 160, discussed above), with proper terminal connection. Thus, if the source and body terminals of the body-tab FET are electrically shorted in 160 (say by silicide processing), then those terminals should also be shorted in body-tab sub-FET 176. Further, in item 258, the methods herein determine the fringe field distribution (Fr) as a function of various geometrical parameters including, but not limited to, main FET length and width, and further then multiply body-tab FET mobility by Fr to account for fringe field penetration. This is followed by item 260, where such methods completely characterize body-tab FET.

Proceeding to item 262 in FIG. 10, methods herein form a sub-circuit for the body-tab FET, body-contact (BC)-FET, and floating-body (FB)-FET. In item 264, these methods use any fixed width partition between BC and FB-FETs (e.g., 60:40), followed by iterative tuning, and standard flow compact model extraction. Item 266 shows that methods herein adjust W_BC to match impact ionization and diode current; and the rest is assigned to W_FB (FIG. 5). In item 268, these methods adjust the impact ionization and diode parameters in FB-FET to get the Gds Kink. The on-state (when gate voltage is greater than threshold voltage) breakdown can be obtained by combining parasitic bipolar transistor parameters of the above mentioned BC and FB-FETs.

Therefore, in item 270, these methods Adjust impact ionization and diode parameters, along with the parasitic bipolar transistor parameters in BC and FB FETs, to get on-state breakdown. Also, in item 272, such methods adjust junction capacitance (Cjunction), body resistance (Rbody) of the body-tab FET and BC-FET to get proper frequency response of overlap capacitance (Coverlap), Cjunction, and gate resistance (Rgate). As shown by the loop from item 272 back to item 264, processing repeats until the floating-body effects are captured, while keeping doping, mobility, stress parameters the same between body-contact and floating-body FETs.

One example of model extraction methodology is presented below, and described with reference to FIG. 11 (although those skilled in the art would understand that other extractions could be used herein). As used herein, Idlin is drain current (Id) at small drain voltage (Vdlin) (e.g., 0.05V), Vtlin is threshold voltage (Vth) at Vdlin, Idsat is Id at Vd=Vdnom (Nominal Vd for a given technology), Gmlin=∂Id/∂Vg at Vdlin, where NF is the number of parallel devices electrically connected. Such extraction starts with length-etch-bias, width-etch-bias, extra-width-due-to-N+-poly-body-tab (ΔWBC), and width scaling parameters to zero.

Then, the model extraction chooses Wwide-Llong (device 2 in FIG. 11) and, for the main FET model, this processing uses long channel Vth, mobility, mobility degradation and source-drain resistance parameters to get main Gmlin peak, position and slope as a function gate voltage (Vg). In the body-tab FET model (if the second Gmlin peak is present, otherwise this is skipped) the extraction uses long channel Vth, α (shown in the Fr column in FIG. 12), mobility degradation and source-drain resistance parameters to get the Gmlin second peak, position and slope as a function Vg. α is a function of different process parameters, but not limited to (e.g. PCWidthOnBP, A-body-tab, PC-to-BP etc).

Following this, the extraction chooses Wnarrow-Llong device (device 1 in FIG. 11) and, in the main FET model, extracts width scaling Vth, mobility, mobility degradation and source-drain resistance parameters to match, to get main Gmlin peak, position and slope as a function Vg. In the body-tab FET model, the second Gmlin peak is automatically captured, if not width scaling parameters for mobility degradation are used (if the second Gmlin peak is present in Wwide-Llong).

Then this extraction uses long channel Vth, α, mobility degradation and source-drain resistance parameters to get Gmlin the second peak position and slope as a function Vg (if 2nd Gmlin peak is absent in Wwide-Llong). Next, this processing uses regular extraction method for the main FET to get Larray at Wnom and Warray at Lnom. These parameters are copied to body-tab FET model.

Figure 11:
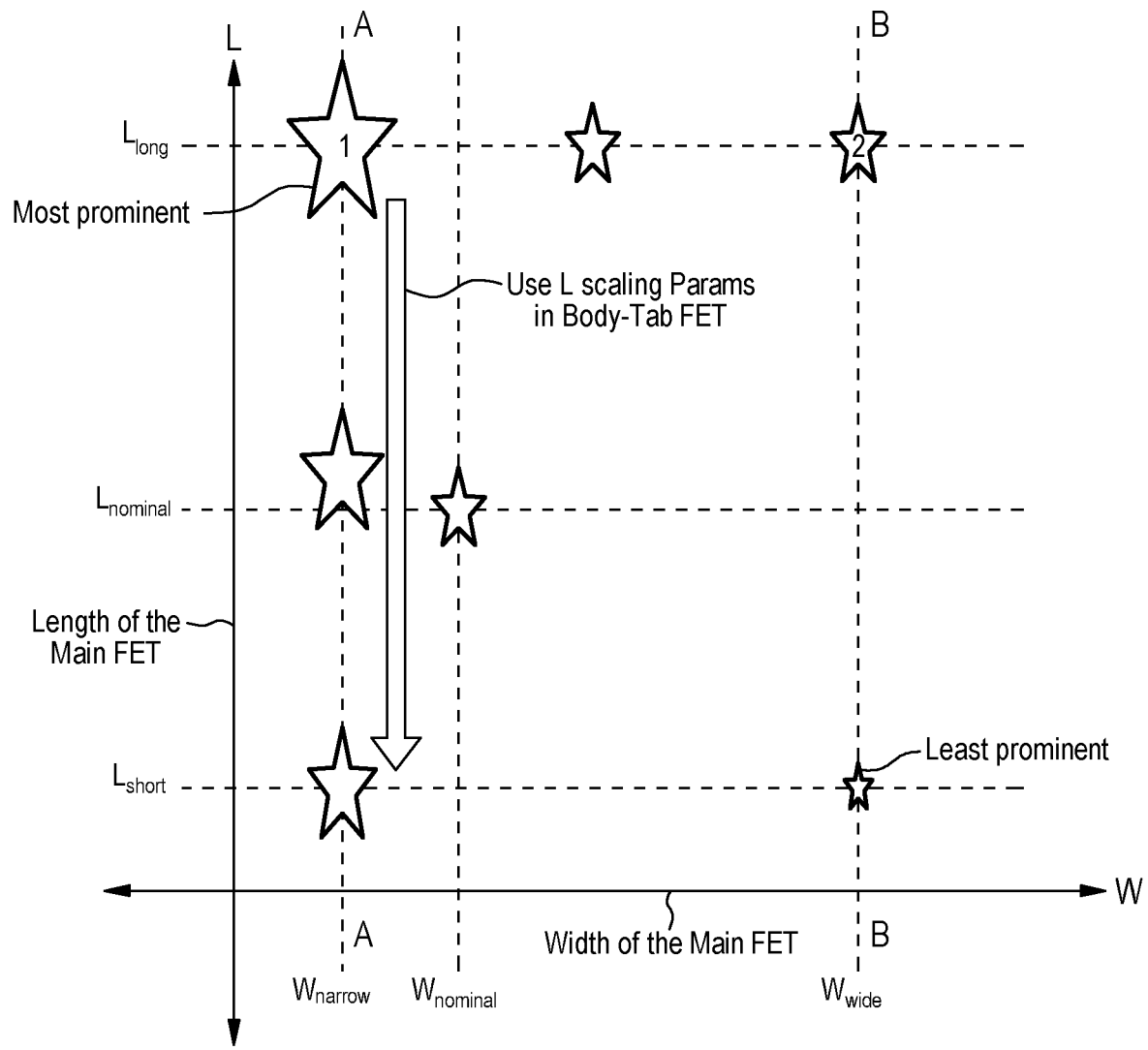
FIG. 11 is a schematic diagram illustrating an exemplary extraction herein.

This processing further calculates the following expression for Larray, as body-tab effects do not scale with width, and assuming Wnom to Wnarrow scaling trends for the main FET are captured (moving along A-A' in FIG. 11).

$$I_{Body-TabFET-lin}(L) = Idlin(W_{wide}, L) - \frac{Idlin(W_{wide}, L) - Idlin(W_{narrow}, L)}{W_{wide} - W_{narrow}} \times W_{wide}$$

In the above, Idlin (Wwide,L) and Idlin (Wnarrow,L) are adjusted for width scaling of Vtlin between Wwide and Wnarrow. The above expression is evaluated at different Vg.

This processing then uses the body-tab FET parameters to match the above expression in the regular extraction method as function of Vg. In this, the processing adjusts β (as shown in the Fr column in FIG. 12), length scaling Vth and mobility parameters to get the correct Gmlin second peak and above expression for entire Larray (as function of Vg). Where β is a function of different process parameters, but not limited to (e.g. PCWidthOnBP, A-body-tab, PC-to-BP etc).

Then, the following expression is evaluated for Larray as function of Vg. This uses drain-induced-barrier-lowering (DIBL), body charge parameters, and length scaling of those to capture following expression for entire Larray (moving along A-A' in FIG. 11).

$$I_{Body-TabFET-sat}(L) = Idsat(W_{wide}, L) - \frac{Idsat(W_{wide}, L) - Idsat(W_{narrow}, L)}{W_{wide} - W_{narrow}} \times W_{wide}$$

Then this extraction uses stress parameters (for Vth and mobility) in the body-tab FET to capture following expression as a function NF.

$$I_{Body-TabFET-NF}(L_{nom}, NF) = Idlin(W_{wide}, L_{nom}, NF) - \frac{Idlin(W_{wide}, L_{nom}, NF) - Idlin(W_{narrow}, L_{nom}, NF)}{W_{wide} - W_{narrow}} \times W_{wide}$$

In the foregoing, Idlin (Wwide,Lnom,NF) and Idlin (Wnarrow,Lnom,NF) are Idlin at Vg=Vdnom, Vd=Vdlin and are normalized by NF. This processing evaluates the above expression for different NF. This uses length scaling of stress parameters to capture different stress trends at other lengths (i.e. L≠nom).

With respect to capacitances, this extraction uses a standard modeling flow to capture capacitances for Vg<Vth_Body-Tab-FET, where Vth_Body-Tab-FET is the onset of body-tab FET inversion. This uses Vth-offset-for-capacitance and etch-bias-body-contact-isolation-region (deltaBP) in the body-tab FET to match Wwide-Llong gate capacitances for Vg>Vth_Body-Tab-FET. Further, low and high frequency trans-capacitances for Wnarrow-Larray can be modeled with appropriate charge parameters and/or length scaling of those in the body-tab FET model.

FIG. 12 is a schematic diagram illustrating aspects of systems herein. More specifically, FIG. 12 is a table showing the body-contact type in the first column, a schematic of such body types in the second column, the calculation for the area of the body-tab in the third column, the calculation for the length of the body-tab in the fourth column, the body-tab width in the fifth column, and the Fr calculation in the seventh column. While one example is shown in FIG. 12, the embodiments are not limited to this specific example, but instead are applicable to all similar concepts.

Within a transistor, the semiconductor (or channel) is positioned between a conductive "source" region and a similarly conductive "drain" region and when the semiconductor is in a conductive state, the semiconductor allows electrical current to flow between the source and drain. A "gate" is a conductive element that is electrically separated from the semiconductor by a "gate oxide" (which is an insulator) and current/voltage within the gate changes the conductivity of the channel of the transistor.

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide. The thickness of dielectrics herein may vary contingent upon the required device performance.

Generally, transistor structures are formed by depositing or implanting impurities into a substrate to form at least one semiconductor channel, bordered by shallow trench isolation regions below the top (upper) surface of the substrate. A "substrate" herein can comprise any material appropriate for the given purpose (whether now known or developed in the future) and can comprise, for example, silicon-based wafers (bulk materials), ceramic materials, organic materials, oxide materials, nitride materials, etc., whether doped or undoped. The "shallow trench isolation" (STI) structures are generally formed by patterning openings/trenches within the substrate and growing or filling the openings with a highly insulating material (this allows different active areas of the substrate to be electrically isolated from one another).

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

Figure 13:
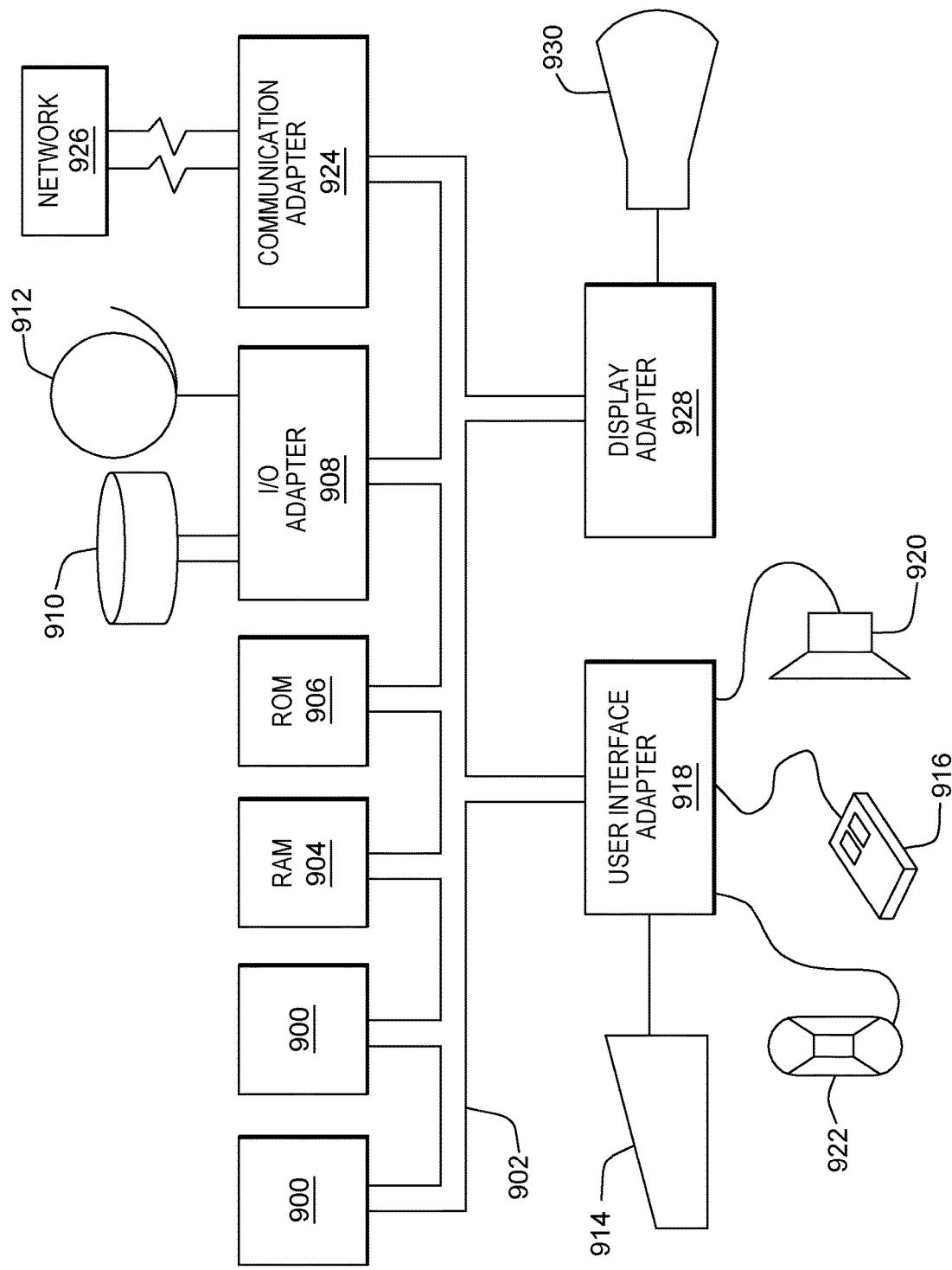
FIG. 13 is a schematic diagram of a hardware system according to embodiments herein.

A representative hardware environment (i.e., a computer system) for implementing the systems, methods and computer program products disclosed above is depicted in FIG. 13. This schematic drawing illustrates a hardware configuration of an information handling/computer system in accordance with the embodiments herein. The system incorporates at least one processor or central processing unit (CPU) 900. The CPUs 900 are interconnected via a system bus 902 to various devices such as a random access memory (RAM) 904, read-only memory (ROM) 906, and an input/output (I/O) adapter 908. The I/O adapter 908 can connect to peripheral devices, such as disk units 910 and tape drives 912, or other program storage devices that are readable by the system. The system can read the inventive instructions on the program storage devices and follow these instructions to execute the methodology of the embodiments herein. The system further includes a user interface adapter 918 that connects a keyboard 914, mouse 916, speaker 920, microphone 922, and/or other user interface devices such as a touch screen device (not shown) to the bus 902 to gather user input. Additionally, a communication adapter 924 connects the bus 902 to a data processing network 926, and a display adapter 928 connects the bus 902 to a display device 930 which may be embodied as an output device such as a monitor, printer, or transmitter, for example.

The flowchart and block diagrams in the figures illustrate the architecture, functionality, and operation of possible implementations of devices and methods according to various embodiments. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

Each respective figure, in addition to illustrating methods of and functionality of the present embodiments at various stages, also illustrates the logic of the method as implemented, in whole or in part, by one or more devices and structures. Such devices and structures are configured to (i.e., include one or more components, such as resistors, capacitors, transistors and the like that are connected to enable the performing of a process) implement the method described above. In other words, one or more computer hardware devices can be created that are configured to implement the method and processes described herein with reference to the figures and their corresponding descriptions.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A method comprising:
producing a simulation circuit comprising an actual physical circuit that simulates characteristics of transistors having different sub-transistor portions, wherein the simulation circuit is produced to include: an isolation body resistor representing resistance of a channel isolation portion of the sub-transistor portions of the transistors; a main body resistor representing resistance of a main channel portion of the sub-transistor portions of the transistors;
an isolation transistor connected to the isolation body resistor; and a body-contact transistor connected to the main body resistor;
generating simulated data by supplying test inputs to the simulation circuit while selectively activating either the isolation transistor or the body-contact transistor;
generating test data by supplying the test inputs to the transistors and measuring output of the transistors;
comparing the simulated data to the test data to identify data differences;
changing a design of the transistors to reduce the data differences;
repeating the generating test data, the comparing, and the changing the design, until the data differences are within a threshold to produce a final design; and
outputting the final design,
wherein a main gate portion of a gate conductor of the transistors includes a gate body-contact portion of the sub-transistor portions adjacent a gate isolation portion of the sub-transistor portions, and a gate floating-body portion of the sub-transistor portions distal to the gate isolation portion,
wherein the main channel portion of the transistors includes a channel floating-body portion of the sub-transistor portions adjacent the gate floating-body portion of the gate conductor,
wherein a floating-body sub-transistor of the transistors comprises the gate floating-body portion of the gate conductor and the channel floating-body portion, and
wherein the simulation circuit is produced to include a floating-body sub-transistor simulation, that simulates the floating-body sub-transistor of the transistors, and that comprises the gate floating-body resistor and the floating-body transistor.

2. The method according to claim 1, wherein the simulation circuit is produced to further include:
a gate isolation resistor, representing resistance of the gate isolation portion, connected to the isolation transistor;
a gate body-contact resistor, representing resistance of the gate body-contact portion, connected to the body-contact transistor;
a gate floating-body resistor, representing resistance of the gate floating-body portion; and
a floating-body transistor connected to the gate floating-body resistor.

3. The method according to claim 2, wherein the main channel portion of the transistors includes a channel body-contact portion of the sub-transistor portions adjacent the gate body-contact portion of the gate conductor, wherein a body-tab sub-transistor of the transistors comprises the gate isolation portion of the gate conductor and the channel isolation portion, wherein the simulation circuit is produced to include a body-tab sub-transistor simulation, that simulates the body-tab sub-transistor of the transistors, and that comprises the gate isolation resistor, the isolation body resistor, and the isolation transistor, wherein a body-contact sub-transistor of the transistors comprises the gate body-contact portion of the gate conductor and the main channel portion, and wherein the simulation circuit is produced to include a body-contact sub-transistor simulation, that simulates the body-contact sub-transistor of the transistors, and that comprises the gate body-contact resistor, the main body resistor, and the body-contact transistor.

4. The method according to claim 3, wherein activation of the isolation transistor, combined with deactivation of the body-contact transistor and floating-body transistor, provides body-tab simulation data from the body-tab sub-transistor simulation, wherein activation of the body-contact transistor, combined with deactivation of the isolation transistor and floating-body transistor, provides body-contact simulation data from the body-contact sub-transistor simulation, and wherein activation of the floating-body transistor, combined with deactivation of the isolation transistor and body-contact transistor, provides floating-body simulation data from a floating-body sub-transistor simulation.

5. The method according to claim 1, wherein the producing the simulation circuit comprises:
receiving design input; and
performing a model extraction process to establish characteristics of the isolation body resistor and the main body resistor, the isolation transistor, and the body-contact transistor, using the design input.

6. The method according to claim 5, wherein the design input includes transistor current, transistor voltage, transistor length, and transistor width of the transistors, and
wherein different characteristics of the design input change aspects of the simulation circuit produced by the model extraction process.

7. The method according to claim 1, wherein selective activation of the isolation transistor and the body-contact transistor restricts which resistor in the simulation circuit receives the test inputs, so as to produce independent simulated data for the isolation body resistor and the main body resistor.

8. A method comprising:
supplying manufactured dynamically depleted silicon-on-insulator (DDSOI) metal oxide semiconductor field effect transistors (MOSFETs) having different sub-transistor portions, wherein the DDSOI MOSFETs include:
a gate conductor that has a gate isolation portion of the sub-transistor portions and a main gate portion of the sub-transistor portions that have different doping impurities; and
a semiconductor channel separated from the gate conductor by a gate insulator, the semiconductor channel has a channel isolation portion of the sub-transistor portions adjacent the gate isolation portion of the gate conductor, and a main channel portion of the sub-transistor portions adjacent the main gate portion of the gate conductor;

producing a simulation circuit comprising an actual physical circuit that simulates characteristics of the DDSOI MOSFETs, wherein the simulation circuit is produced to include:
an isolation body resistor representing resistance of the channel isolation portion;
a main body resistor representing resistance of the main channel portion;
an isolation transistor connected to the isolation body resistor; and
a body-contact transistor connected to the main body resistor;
physically connecting the DDSOI MOSFETs to a testing system;
generating simulated data by supplying test inputs to the simulation circuit while selectively activating either the isolation transistor or the body-contact transistor;
generating test data by supplying the test inputs to the DDSOI MOSFETs and measuring output of the DDSOI MOSFETs using the testing system;
comparing the simulated data to the test data to identify data differences;
changing a design of the DDSOI MOSFETs to reduce the data differences;
repeating the generating test data, the comparing, and the changing the design, until the data differences are within a threshold to produce a final design; and
outputting the final design,
wherein a main gate portion of a gate conductor of the transistors includes a gate body-contact portion of the sub-transistor portions adjacent a gate isolation portion of the sub-transistor portions, and a gate floating-body portion of the sub-transistor portions distal to the gate isolation portion,
wherein the main channel portion of the transistors includes a channel floating-body portion of the sub-transistor portions adjacent the gate floating-body portion of the gate conductor,
wherein a floating-body sub-transistor of the transistors comprises the gate floating-body portion of the gate conductor and the channel floating-body portion, and
wherein the simulation circuit is produced to include a floating-body sub-transistor simulation, that simulates the floating-body sub-transistor of the transistors, and that comprises the gate floating-body resistor and the floating-body transistor.

9. The method according to claim 8, wherein the simulation circuit is produced to further include:
a gate isolation resistor, representing resistance of the gate isolation portion, connected to the isolation transistor;
a gate body-contact resistor, representing resistance of the gate body-contact portion, connected to the body-contact transistor;
a gate floating-body resistor, representing resistance of the gate floating-body portion; and
a floating-body transistor connected to the gate floating-body resistor.

10. The method according to claim 9, wherein the main channel portion of the DDSOI MOSFETs includes a channel body-contact portion of the sub-transistor portions adjacent the gate body-contact portion of the gate conductor,
wherein a body-tab sub-transistor of the DDSOI MOSFETs comprises the gate isolation portion of the gate conductor and the channel isolation portion of the semiconductor channel,
wherein the simulation circuit is produced to include a body-tab sub-transistor simulation, that simulates the body-tab sub-transistor of the DDSOI MOSFETs, and that comprises the gate isolation resistor, the isolation body resistor, and the isolation transistor, wherein a body-contact sub-transistor of the DDSOI MOSFETs comprises the gate body-contact portion of the gate conductor and the main channel portion of the semiconductor channel, and wherein the simulation circuit is produced to include a body-contact sub-transistor simulation, that simulates the body-contact sub-transistor of the DDSOI MOSFETs, and that comprises the gate body-contact resistor, the main body resistor, and the body-contact transistor.

11. The method according to claim 10, wherein activation of the isolation transistor, combined with deactivation of the body-contact transistor and floating-body transistor, provides body-tab simulation data from the body-tab sub-transistor simulation, wherein activation of the body-contact transistor, combined with deactivation of the isolation transistor and floating-body transistor, provides body-contact simulation data from the body-contact sub-transistor simulation, and wherein activation of the floating-body transistor, combined with deactivation of the isolation transistor and body-contact transistor, provides floating-body simulation data from a floating-body sub-transistor simulation.

12. The method according to claim 8, wherein the producing the simulation circuit comprises:

receiving design input; and performing a model extraction process to establish characteristics of the isolation body resistor and the main body resistor, the isolation transistor, and the body-contact transistor, using the design input.

13. The method according to claim 12, wherein the design input includes transistor current, transistor voltage, transistor length, and transistor width of the DDSOI MOSFETs, and wherein different characteristics of the design input change aspects of the simulation circuit produced by the model extraction process.

14. The method according to claim 8, wherein selective activation of the isolation transistor and the body-contact transistor restricts which resistor in the simulation circuit receives the test inputs, so as to produce independent simulated data for the isolation body resistor and the main body resistor.

15. A system comprising:

a user input capable of receiving characteristics of dynamically depleted silicon-on-insulator (DDSOI) metal oxide semiconductor field effect transistors (MOSFETs) having different sub-transistor portions, wherein the DDSOI MOSFETs include:

a gate conductor that has a gate isolation portion of the sub-transistor portions and a main gate portion of the sub-transistor portions that have different doping impurities; and a semiconductor channel separated from the gate conductor by a gate insulator, the semiconductor channel has a channel isolation portion of the sub-transistor portions adjacent the gate isolation portion of the gate conductor, and a main channel portion of the sub-transistor portions adjacent the main gate portion of the gate conductor;

a processor, in communication with the user input, that is capable of producing a simulation circuit comprising an actual physical circuit that simulates characteristics of the DDSOI MOSFETs, wherein the simulation circuit is produced by the processor to include:

an isolation body resistor representing resistance of the channel isolation portion;

a main body resistor representing resistance of the main channel portion;

an isolation transistor connected to the isolation body resistor; and a body-contact transistor connected to the main body resistor, wherein the processor is capable of generating simulated data by supplying test inputs to the simulation circuit while selectively activating either the isolation transistor or the body-contact transistor; and a testing system capable of being physically connected to the DDSOI MOSFETs, wherein the testing system is capable of generating test data by supplying the test inputs to the DDSOI MOSFETs and measuring output of the DDSOI MOSFETs, wherein the processor is capable of comparing the simulated data to the test data to identify data differences, wherein the user input is capable of receiving changes to a design of the DDSOI MOSFETs to reduce the data differences, wherein the processor and the testing system are capable of repeating the generating test data, the comparing, and the changing the design, until the data differences are within a threshold to produce a final design, and wherein the processor is capable of outputting the final design, wherein a main gate portion of a gate conductor of the transistors includes a gate body-contact portion of the sub-transistor portions adjacent a gate isolation portion of the sub-transistor portions, and a gate floating-body portion of the sub-transistor portions distal to the gate isolation portion, wherein the main channel portion of the transistors includes a channel floating-body portion of the sub-transistor portions adjacent the gate floating-body portion of the gate conductor, wherein a floating-body sub-transistor of the transistors comprises the gate floating-body portion of the gate conductor and the channel floating-body portion, and wherein the simulation circuit is produced to include a floating-body sub-transistor simulation, that simulates the floating-body sub-transistor of the transistors, and that comprises the gate floating-body resistor and the floating-body transistor.

16. The system according to claim 15, wherein the simulation circuit is produced by the processor to further include:

a gate isolation resistor, representing resistance of the gate isolation portion, connected to the isolation transistor;

a gate body-contact resistor, representing resistance of the gate body-contact portion, connected to the body-contact transistor;

a gate floating-body resistor, representing resistance of the gate floating-body portion; and a floating-body transistor connected to the gate floating-body resistor.

17. The system according to claim 16, wherein the main channel portion of the DDSOI MOSFETs includes a channel body-contact portion of the sub-transistor portions adjacent the gate body-contact portion of the gate conductor, wherein a body-tab sub-transistor of the DDSOI MOSFETs comprises the gate isolation portion of the gate conductor and the channel isolation portion of the semiconductor channel, wherein the simulation circuit is produced by the processor to include a body-tab sub-transistor simulation, that simulates the body-tab sub-transistor of the DDSOI MOSFETs, and that comprises the gate isolation resistor, the isolation body resistor, and the isolation transistor, wherein a body-contact sub-transistor of the DDSOI MOSFETs comprises the gate body-contact portion of the gate conductor and the main channel portion of the semiconductor channel, and wherein the simulation circuit is produced by the processor to include a body-contact sub-transistor simulation, that simulates the body-contact sub-transistor of the DDSOI MOSFETs, and that comprises the gate body-contact resistor, the main body resistor, and the body-contact transistor.

18. The system according to claim 17, wherein activation of the isolation transistor, combined with deactivation of the body-contact transistor and floating-body transistor by the processor, provides body-tab simulation data from the body-tab sub-transistor simulation, wherein activation of the body-contact transistor, combined with deactivation of the isolation transistor and floating-body transistor by the processor, provides body-contact simulation data from the body-contact sub-transistor simulation, and wherein activation of the floating-body transistor, combined with deactivation of the isolation transistor and body-contact transistor by the processor, provides floating-body simulation data from a floating-body sub-transistor simulation.

19. The system according to claim 15, wherein the processor is capable of performing a model extraction process to establish characteristics of the isolation body resistor and the main body resistor, the isolation transistor, and the body-contact transistor, using the characteristics of the DDSOI MOSFETs when producing the simulation circuit.

20. The system according to claim 19, wherein the characteristics of the DDSOI MOSFETs include transistor current, transistor voltage, transistor length, and transistor width of the DDSOI MOSFETs, and wherein different characteristics of the DDSOI MOSFETs change aspects of the simulation circuit produced by the model extraction process.

* * * * *